United States Patent
Kubota

(10) Patent No.: US 12,052,904 B2
(45) Date of Patent: Jul. 30, 2024

(54) ELECTRO-OPTICAL DEVICE AND ELECTRONIC APPARATUS

(71) Applicant: SEIKO EPSON CORPORATION, Tokyo (JP)

(72) Inventor: Takehiko Kubota, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 357 days.

(21) Appl. No.: 17/586,052

(22) Filed: Jan. 27, 2022

(65) Prior Publication Data
US 2022/0238844 A1    Jul. 28, 2022

(30) Foreign Application Priority Data

Jan. 28, 2021    (JP) .................................. 2021-011753

(51) Int. Cl.
*H10K 59/82*    (2023.01)
*H10K 59/80*    (2023.01)

(52) U.S. Cl.
CPC ................................ *H10K 59/876* (2023.02)

(58) Field of Classification Search
CPC .................................................... H10K 59/876
USPC ....................................................... 313/506
See application file for complete search history.

(56) References Cited

U.S. PATENT DOCUMENTS

| | | | |
|---|---|---|---|
| 7,365,488 B2 * | 4/2008 | Lee ......................... | H10K 59/35 |
| | | | 428/917 |
| 8,013,521 B2 * | 9/2011 | Gonda ................. | H10K 59/805 |
| | | | 313/506 |
| 8,362,688 B2 * | 1/2013 | Noda .................... | H10K 59/805 |
| | | | 313/506 |
| 2015/0060792 A1 * | 3/2015 | Lee ....................... | H10K 50/858 |
| | | | 438/23 |
| 2015/0144926 A1 * | 5/2015 | Lee ....................... | H10K 59/876 |
| | | | 257/40 |
| 2019/0035862 A1 | 1/2019 | Koshihara | |
| 2024/0032401 A1 * | 1/2024 | Ogura .................... | H05B 33/24 |

FOREIGN PATENT DOCUMENTS

| | | |
|---|---|---|
| JP | 2008-041341 A | 2/2008 |
| JP | 2016-170936 A | 9/2016 |
| JP | 2019-029188 A | 2/2019 |

* cited by examiner

*Primary Examiner* — Christopher M Raabe
(74) *Attorney, Agent, or Firm* — Oliff PLC

(57) ABSTRACT

An organic EL device includes a counter electrode, a first reflection layer provided so as to be separate from the counter electrode by a first optical distance, a first pixel electrode provided between the counter electrode and the first reflection layer, a light emitting layer provided between the counter electrode and the first pixel electrode, an optical distance adjustment layer provided between the first pixel electrode and the first reflection layer, and a first relay electrode provided between the first pixel electrode and the first reflection layer, and configured to electrically couple the first pixel electrode and the first reflection layer, wherein the optical distance adjustment layer is provided so as to be separate from the first relay electrode.

14 Claims, 13 Drawing Sheets

ELECTRO-OPTICAL DEVICE AND ELECTRONIC APPARATUS

The present application is based on, and claims priority from JP Application Serial Number 2021-011753, filed Jan. 28, 2021, the disclosure of which is hereby incorporated by reference herein in its entirety.

BACKGROUND

1. Technical Field

The present disclosure relates to an electro-optical device and an electronic apparatus.

2. Related Art

Recently, an electro-optical device is known that includes a light emitting element such as an organic EL (electroluminescence) element and a color filter that transmits a predetermined wavelength region of light emitted from the light emitting element. Some such electro-optical devices include a light resonance structure that resonates light emitted from the light emitting element.

For example, JP-A-2019-29188 discloses an electro-optical device in which ore display unit is constituted by a pixel constituted of a plurality of sub-pixels, and a pixel electrode and a reflection layer are electrically coupled via a contact electrode in a light emitting element corresponding to a sub-pixel. In the electro-optical device, the film thicknesses of a first distance adjustment layer and a second distance adjustment layer are adjusted so as to form a light resonance structure that resonates light in a predetermined wavelength region by a reflection layer and a counter electrode.

However, in the electro-optical device described in JP-A-2019-29188, there is a problem in that it is difficult to improve the sealing performance of the red and green sub-pixels as compared to the blue sub-pixel. The factor that is difficult to improve the sealing performance is, for example, a thickness of a lower side sealing layer above a contact portion where the contact electrode and the reflection layer come into contact. Specifically, when a width of the contact portion is increased in order to sufficiently ensure a contact portion between the contact electrode and the reflection layer, the upper layer drops inside the contact portion and also results in a recess in a light emitting layer. As a result, when the lower side sealing layer is formed above the light emitting layer by vapor deposition, etc., there is a possibility that the sticking of the lower side sealing layer may be deteriorated, and the thickness of the lower side sealing layer above the contact portion may be reduced due to the width of the recess. When the thickness of the lower side sealing layer becomes thinner, sealing performance will decline, and moisture, etc. will easily enter. In other words, there is a need for an electro-optical device that improves sealing performance.

SUMMARY

An electro-optical device includes an electrode, a first reflection layer provided so as to be separate from the electrode by a first optical distance, a first pixel electrode provided between the electrode and the first reflection layer, a light emitting layer provided between the electrode and the first pixel electrode, a first optical distance adjustment layer provided between the first pixel electrode and the first reflection layer, and a first relay layer provided between the first pixel electrode and the first reflection layer, and configured to electrically couple the first pixel electrode and the first reflection layer, wherein the first optical distance adjustment layer is provided so as to be separate from the first relay layer.

An electronic apparatus includes the electro-optical device described above.

DESCRIPTION OF EXEMPLARY EMBODIMENTS

Exemplary embodiments of the present disclosure will be described below with reference to the accompanying drawings. The exemplary embodiments described below describe an example of the present disclosure. The present disclosure is not limited to the following exemplary embodiments.

Note that, in each of the drawings below, to illustrate each of layers or each of members at a recognizable size, a scale of each of the layers or each of the members is different from an actual scale. In the following description, with respect to a substrate, for example, a description of "at a substrate" means either the case where it is disposed in contact with the substrate, where it is disposed at the substrate via another structure, or where a part is disposed in contact with the substrate and a part is disposed via another structure.

Furthermore, in the following drawings, XYZ axes are given as coordinate axes orthogonal to each other as necessary, a direction indicated by each of arrows is indicated as a +direction, and a direction opposite the +direction is indicated as a −direction. The Z direction may be referred to as an upward direction, and the −Z direction may be referred to as a downward direction, and viewing from the +Z direction is referred to as plan view or a planar manner. The +Z direction is also the direction in which the organic EL device described below emits light.

1. First Exemplary Embodiment

In the present exemplary embodiment, an organic EL (electroluminescence) device is illustrated as an electro-optical device. This organic EL device is suitably used, for example, in a head-mounted display (HMD) as an electronic apparatus described below, etc. The outline of an organic EL device 1 according to the present exemplary embodiment will be described with reference to FIGS. 1 and 2. Note that FIG. 2 illustrates a pixel circuit 100 in the m-th row and the k-th column described below.

Figure 1:
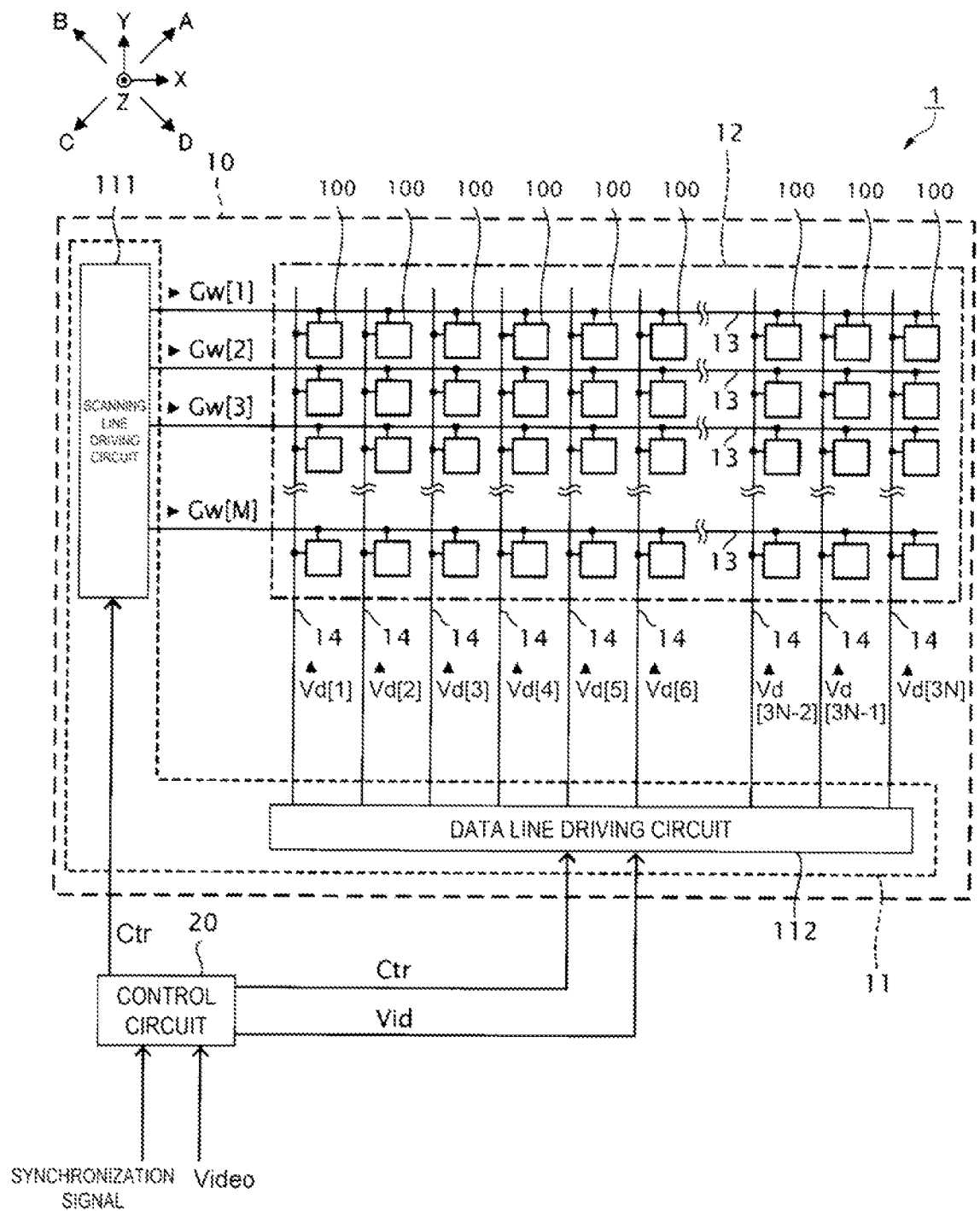
FIG. 1 is a block diagram illustrating a configuration of an organic EL device as an electro-optical device according to an first exemplary embodiment.
Figure 2:
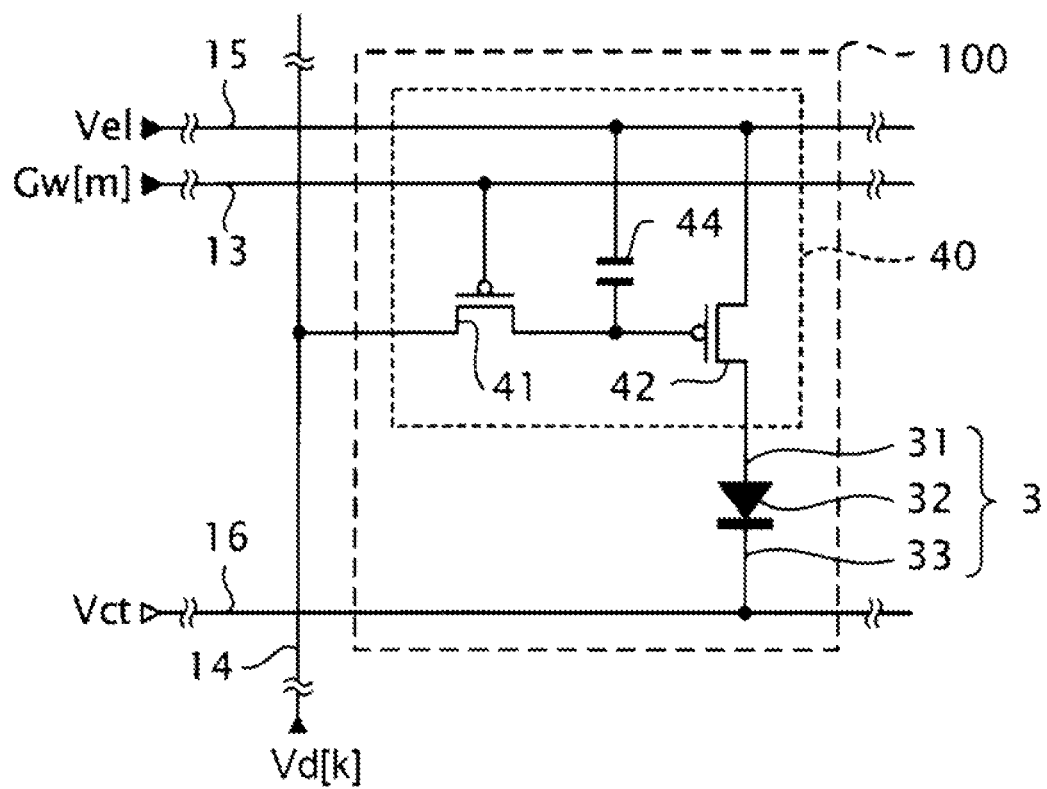
FIG. 2 is an equivalent circuit diagram illustrating an electrical configuration of a light emitting pixel in the organic EL device.

As shown in FIG. 1, the organic EL device 1 of the present exemplary embodiment includes a display panel 10 having a plurality of sub-pixels Px described below, and a control circuit 20 for controlling operation of the display panel 10.

Digital image data Video is supplied to the control circuit 20 in synchronization with a synchronization signal from a host device (not illustrated). Here, the image data Video is digital data that defines a gray-scale level to be displayed by each sub-pixel Px of the display panel 10. Moreover, the synchronization signal means a signal including a vertical synchronization signal, a horizontal synchronization signal, and a dot clock signal, etc.

The control circuit 20 generates a control signal Ctr that controls operation of the display panel 10 based on the synchronization signal, and supplies the generated control signal Ctr to the display panel 10. Further, the control Circuit 20 generates an analog image signal Vid based on the image data Video, and supplies the generated image signal Vid to the display panel 10. Here, the image signal Vid is a signal defining a luminance of a light emitting element included in the sub-pixel Px so that each sub-pixel Px displays a specified gray-scale of the image data Video.

The display panel 10 includes M scanning lines 13 that extend along the X-axis, 3N data lines 14 that extend along the Y-axis, a display unit 12 having "M×3N" pixel circuits 100 arranged corresponding to the intersection of the M scanning lines 13 and the 3N data lines 14, and a driving circuit 11 that drives the display unit 12. Here, M and N are each independent natural number of 1 or more.

In the following description, the plurality of scanning lines 13 correspond to a first row, a second row, . . . , a M-th row in order in the −Y direction, and the plurality of data lines 14 correspond to a first column, a second column, . . . , a 3N-th column in order in the +X direction in order to distinguish the plurality of sub-pixels Px, the plurality of scanning lines 13, and the plurality of data lines 14 from each other. Furthermore, the +X direction and the +Y direction are referred to as a direction A, the −X direction and the +Y direction are referred to as a direction B, the −X direction and the −Y direction are referred to as a direction C, and the +X direction and the −Y direction are referred to as a direction D.

The plurality of sub-pixels Px provided at the display unit 12 include the pixel circuit 100 included in a sub-pixel Px capable of displaying red color (R), the pixel circuit 100 included in a sub-pixel Px capable of displaying green color (G), and the pixel circuit 100 included in a sub-pixel Px capable of displaying blue color (B). Then, in the organic EL device 1, one case is assumed where, of the first to 3N columns, the pixel circuit 100 included in the sub-pixel Px capable of displaying R is disposed at the (3n−2)-th column, the pixel circuit 100 included in the sub-pixel Px capable of displaying G is disposed at the (3n−1)-th column, and the pixel circuit 100 included in the sub-pixel Px capable of displaying B is disposed at the 3n-th column, where n is a natural number satisfying 1≤n≤N. The driving circuit 11 includes a scanning line driving circuit 111 and a data line driving circuit 112.

The scanning line driving circuit 111 scans (selects) the scanning lines 13 in the first to M-th rows in order. Specifically, in one frame period, the scanning line driving circuit 111 sequentially selects the scanning lines 13 in order for each horizontal scanning period by setting scanning signals Gw [1] to Gw [m] output for each of the scanning lines 13 of the first to M-th rows to predetermined selective potentials in order for each horizontal scanning period. In other words, in the one frame period, the scanning line driving circuit 111 selects the scanning line 13 in the m-th row by setting, in the m-th horizontal scanning period, the scanning signal Gw [m] output for the scanning line 13 in the m-th row to a predetermined selective potential. Note that the one frame period is a period during which the organic EL device 1 displays one image.

The data line driving circuit 112 outputs analog data signals Vd [1] to Vd [3N] that define the gray-scale to be displayed by each pixel circuit 100 to the 3N data lines 14 for each horizontal scanning period based on the image signal Vid and the control signal Ctr supplied from the control circuit 20. In other words, the data line driving circuit 112 outputs the data signal Vd [k] for the data line 14 in the k-th column in each horizontal scanning period.

Note that in the present exemplary embodiment, the image signal Vid output by the control circuit 20 is an analog signal, but the image signal vid output by the control circuit 20 may be a digital signal. In this case, the data line driving circuit 112 performs D/A conversion of the image signal Vid to generate analog data signals Vd [1] to Vd [3N].

As illustrated in FIG. 2, the pixel circuit 100 includes a light emitting element 3 and a supply circuit 40 that supplies a current to the light emitting device 3. The light emitting element 3 has a pixel electrode 31, a light emitting functional layer 32, and a counter electrode 33 as an electrode. The pixel electrode 31 functions as a positive electrode that supplies a hole to the light emitting functional layer 32. The counter electrode 33 is electrically coupled to a power supplying line 16 set to an electric potential Vct, which is a power supply potential on a low potential side of the pixel circuit 100, and functions as a negative electrode that supplies an electron to the light emitting functional layer 32. Then, the hole supplied from the pixel electrode 31 and the electron supplied from the counter electrode 33 are re-coupled by the light emitting functional layer 32, and the light emitting functional layer 32 emits light.

Note that, as will be described in detail below, a red color filter 81R is disposed overlaid at the light emitting element 3 included in the pixel circuit 100 included in the sub-pixel Px capable of emitting light R. A green color filter 81G is disposed overlaid at the light emitting element 3 included in the pixel circuit 100 included in the sub-pixel Px capable of emitting light G. A blue color filter 81B is disposed overlaid at the light emitting element 3 of the pixel circuit 100 capable of emitting light B. Hereinafter, the light emitting element 3 included in the pixel circuit 100 included in the sub-pixel Px capable of emitting light R may also be referred to as a light emitting device 3R; the light emitting element 3 included in the pixel circuit 100 included in the sub-pixel Px capable of emitting light G may also be referred to as a light emitting element 3G; and the light emitting element 3 included in the pixel circuit 100 included in the sub-pixel Px capable of emitting light B may also be referred to as a light emitting element 3B.

The supply circuit 40 includes P-channel type transistors 41, 42 and a retention capacitor 44. Here, one or both of the transistors 41, 42 may be N-channel type transistors. In addition, the present exemplary embodiment illustrates a form in which the transistors 41, 42 are thin film transistors (TFTs), but the present disclosure is not limited thereto. The transistors 41, 42 may be field effect transistors such as MOSFETs (Metal-Oxide-Semiconductor Field-Effect Transistors).

In the transistor 41, the gate is electrically coupled to the scan line 13 in the m-th row, one of the source or drain is electrically coupled to the data line 14 in the k-th column, and the other of the source or drain is electrically coupled to the gate of the transistor 42 and one electrode of the two electrodes included in the retention capacitor 44.

In the transistor 42, the gate is electrically coupled to the other of the source or drain of the transistor 41 and one electrode of the retention capacitor 44, one of the source or drain is electrically coupled to the pixel electrode 31, and the other of the source or drain is electrically coupled to power source wiring 15 to which an electric potential Ve1, which is a power supply potential on a high potential side of the pixel circuit 100, is applied.

In the retention capacitor 44, one electrode of the two electrodes included in the retention capacitor 44 is electrically coupled to the other of the source or drain of the transistor 41 and the gate of the transistor 42, and the other electrode of the two electrodes included in the retention capacitor 44 is electrically coupled to the power source wiring 15. The retention capacitor 44 functions as a retention capacitor that holds the gate potential of the transistor 42.

When the scanning line driving circuit ill selects the scanning line 13 in the m-th row by setting the scanning signal Gw [m] to the predetermined selective potential, the transistor 41 provided at the sub-pixel P [m] [k] in the m-th row and the k-th column is turned on. Then, when the transistor 41 is turned on, the data signal Vd [k] is supplied to the gate of the transistor 42 from the data line 14 in the k-th column. In this case, the transistor 42 supplies a current corresponding to the potential of the data signal Vd [k] supplied to the gate, to be exact, the potential difference between the gate and the source, to the light emitting element 3. That is, the transistor 42 is a drive transistor that supplies a current to the light emitting element 3. The light emitting element 3 emits light with a luminance corresponding to a magnitude of the current supplied from the transistor 42, that is, a luminance corresponding to the potential of the data signal Vd [k].

After that, when the scanning line driving circuit 111 releases the selection of the scanning line 13 in the m-th row and the transistor 41 is turned off, the gate potential of the transistor 42 is held by the retention capacitor 44. Thus, the light emitting device 3 emits light at a luminance corresponding to the data signal Vd (k) even after the transistor 41 is turned off.

Note that while not illustrated in FIG. 2, a component that electrically couples the pixel electrode 31 included in the light emitting device 3 and the supply circuit 40 is referred to as a contact 7. Each sub-pixel Px includes the light emitting element 3, the supply circuit 40, and a contact region Ca at which the contact 7 is disposed. The contact region Ca is a region at which the contact 7 can be disposed.

The contact 7 electrically couples the pixel electrode 31 included in the light emitting device 3 and the supply circuit 40.

Hereinafter, the contact 7 provided at a sub-pixel PxR is also referred to as a contact 7R, the contact 7 provided at a sub-pixel PxG is also referred to as a contact 7G, and the contact 7 provided at a sub-pixel PxB is also referred to as a contact 7B. Further, the contact region Ca at which the contact 7R is disposed is also referred to as a contact region CaR, the contact region Ca at which the contact 7G is disposed is also referred to as a contact region CaG, and the contact region Ca at which the contact 7B is disposed is also referred to as a contact region CaB. Details of the contact 7 will be described below.

Figure 3:
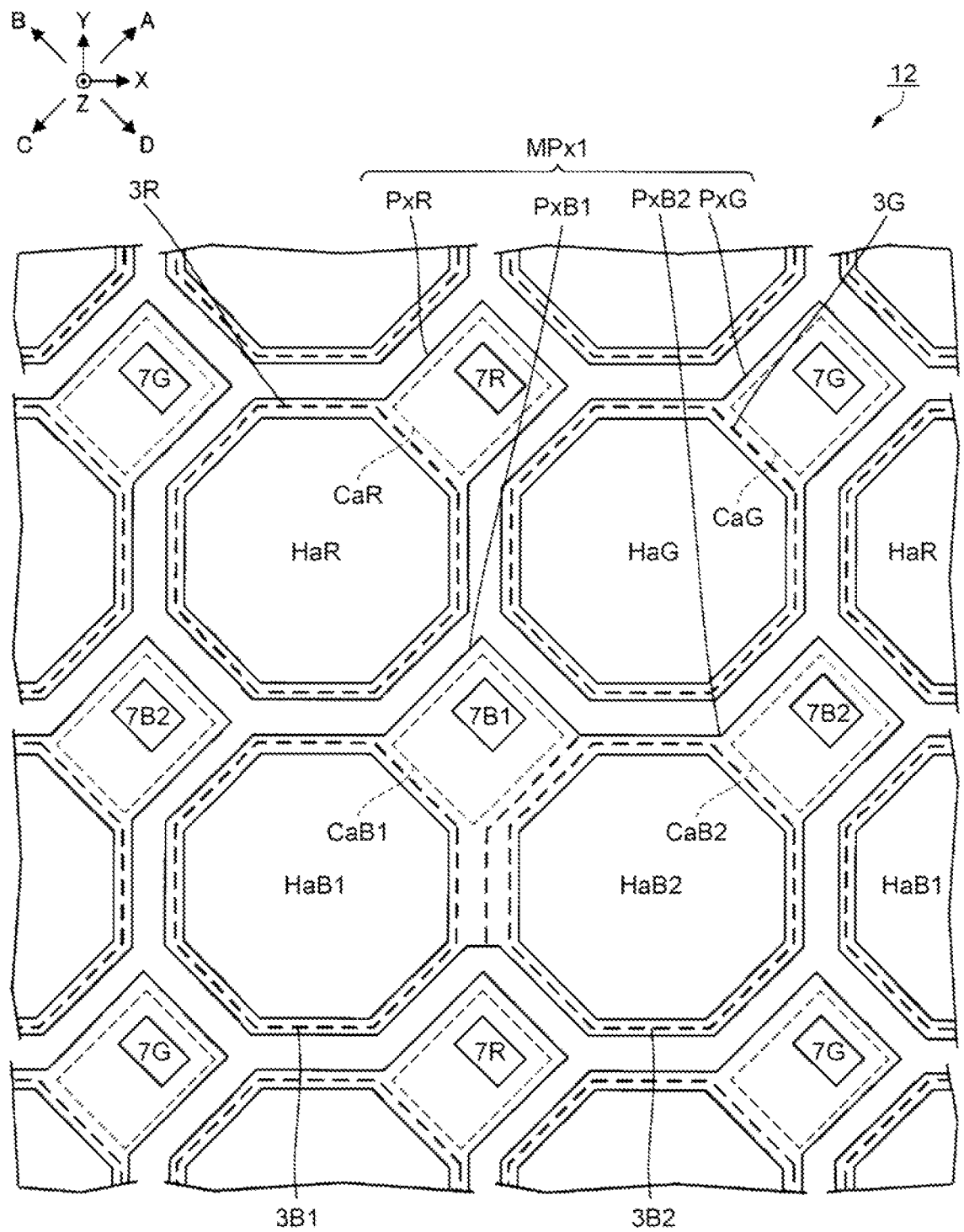
FIG. 3 is a plan view illustrating a configuration of a display unit.
Figure 4:
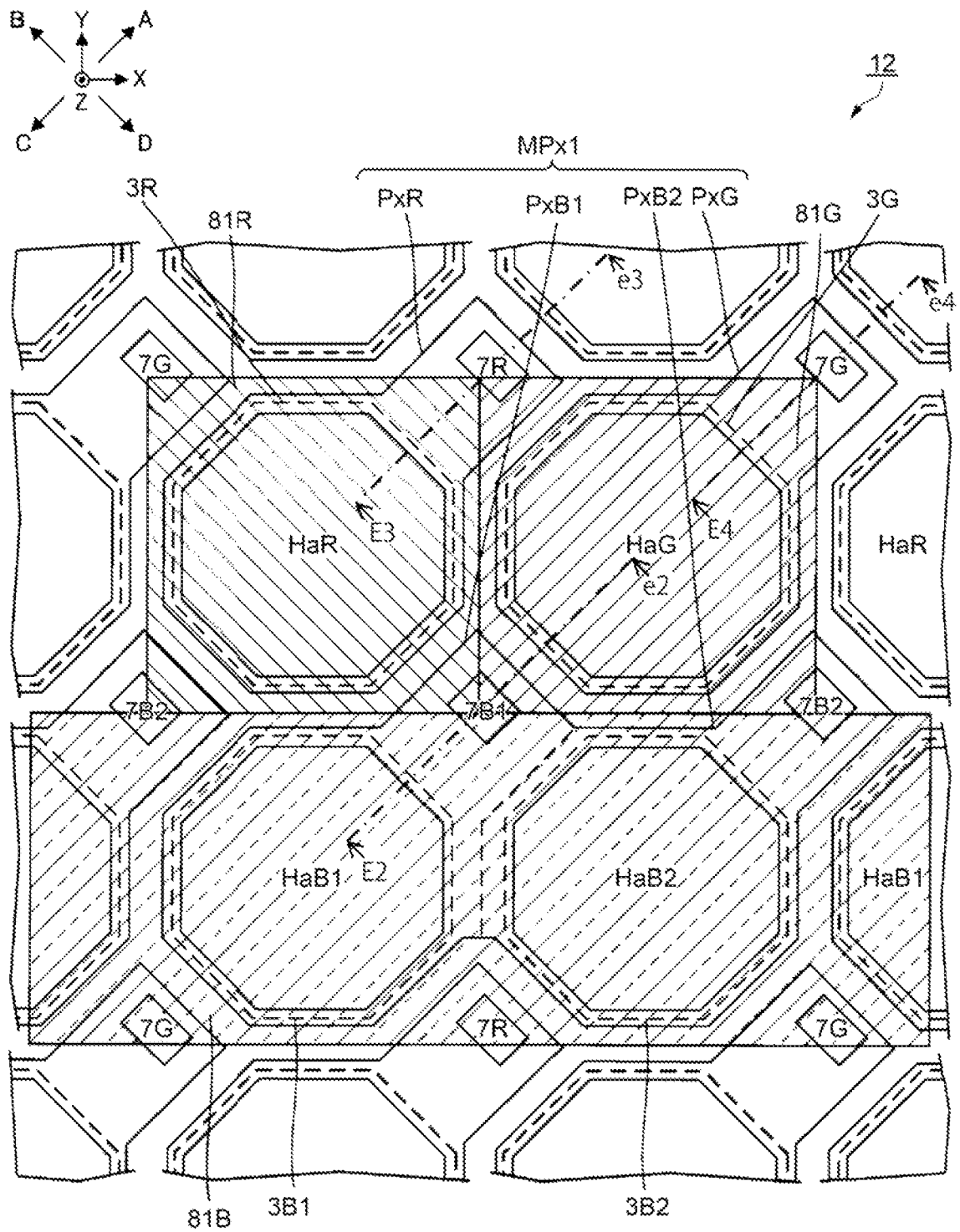
FIG. 4 is a plan view illustrating a configuration of the display unit.
Figure 5:
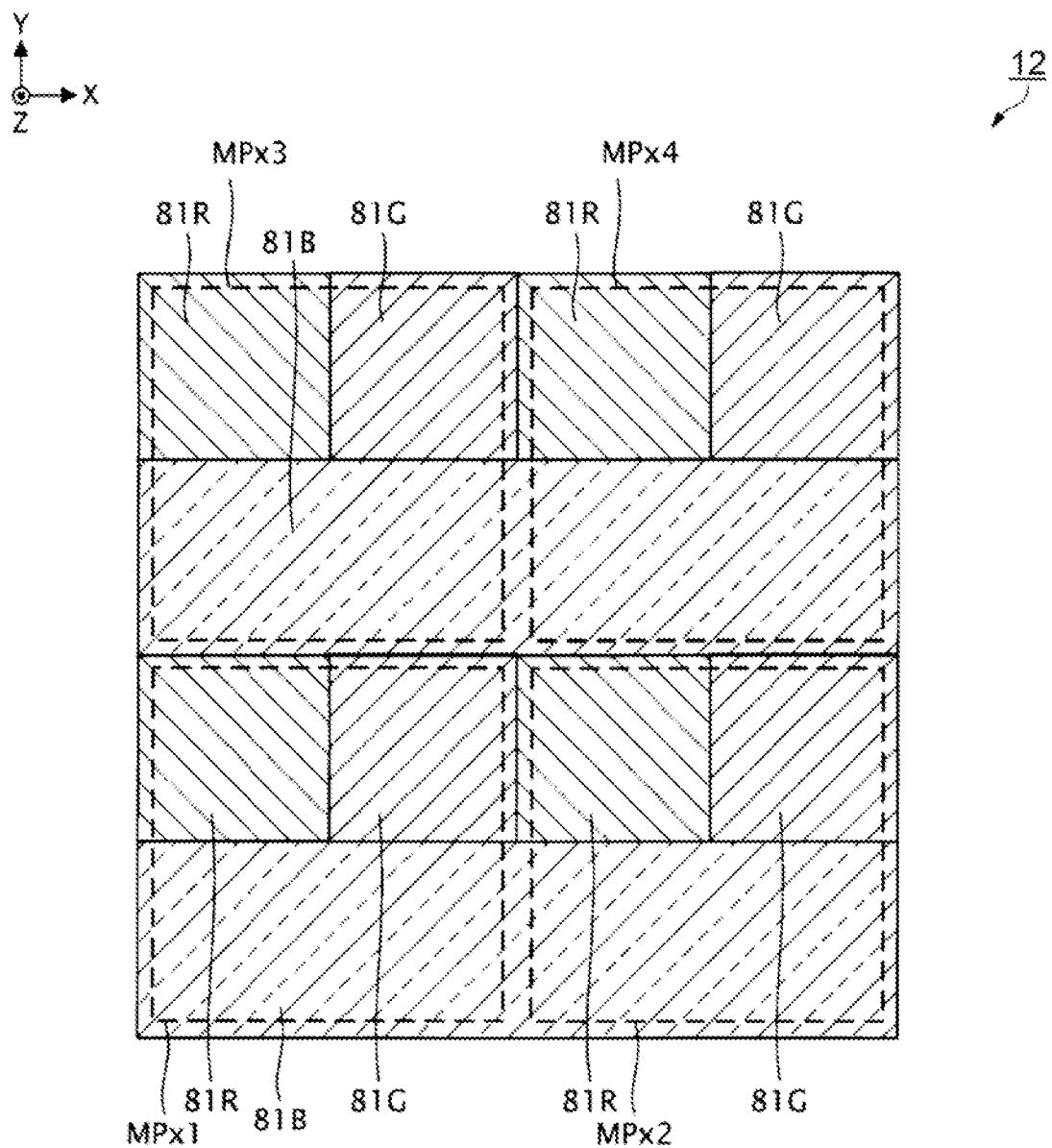
FIG. 5 is a plan view illustrating an arrangement of a pixel and a color filter in the display unit.

A planar configuration of the display unit 12 will be described with reference to FIGS. 3 to 5. In FIG. 3, the color filter 81, which will be described below, is omitted for ease of illustration. In FIG. 4, the color filter 81 is illustrated in FIG. 3, and the contact region Ca is omitted for ease of illustration. In FIG. 5, a pixel MPx1, a pixel MPx2 disposed in the +X direction of the pixel MPx1, a pixel MPx3 disposed in the +Y direction of the pixel MPx1, and a pixel MPx4 disposed in the +Y direction of the pixel MPx2, and the color filter 81 are illustrated.

As illustrated in FIG. 3, one pixel MPx1 in the display unit 12 includes sub-pixels PxR, PxG, PxB1, PxB2. The sub-pixel PxR includes a light emitting element 3R. The sub-pixel PxG includes a light emitting element 3G. The sub-pixel PxB. Includes a light emitting element 3B1. The sub-pixel PxB2 includes a light emitting element 3B2. In other words, the sub-pixel MPx1 includes two sub-pixels PxB1, PxB2 capable of displaying B. A current is supplied to the sub-pixels PxB1, PxB2 from the same supply circuit 40.

The sub-pixels PxB1, PxB2 are disposed along the X-axis. The sub-pixels PxR, PxG are also disposed along the X-axis. The sub-pixels PxB1, PxR are disposed along the Y-axis. The sub-pixels PxG, PxB2 are also disposed along the Y-axis. The sub-pixel PxB1 and the sub-pixel PxB2 located in the +X direction of the sub-pixel PxB1 are coupled by a reflection layer 52, which will be described below. Note that the planar arrangement of the sub-pixels PxR, PxG, PxB1, PxB2 is not limited to the above.

In the present exemplary embodiment, the case is assumed where light emitting regions HaR, HaG, HaB1, HaB2 are formed by each of the light emitting elements 3R, 3G, 3B1, 3B2 included in the pixel MPx. The light emitting regions HaR, HaG, HaB1, HaB2 emit light toward the +Z direction. Hereinafter, the light emitting regions HaP, HaG, HaB1, HaB2 are also referred to collectively as a light emitting regions Ha. The light emitting region Ha is a region in which the pixel electrode 31 described above is provided, and the upper portion of the region is opened by the pixel separation layer 34, which will be described below. The light emitting region Ha is also said to be a region where the pixel electrode 31 and the light emitting functional layer 32 are in contact. Note that an example of a first light emitting region of the present disclosure is the light emitting region HaR, and an example of a second light emitting region of the present disclosure is the light emitting region HaG.

In a planar manner, the shape of the light emitting regions HaR, HaG, HaB1, HaB2 is an octagon. Of each side of the light emitting region Ha, a first side located in the direction C when viewed from the center of the light emitting region Ha, and a fifth side positioned in the direction A when viewed from the center of the light emitting region Ha, are parallel to each other. Of each side of the light emitting region Ha, a second side located in the −Y direction when viewed from the center of the light emitting region Ha, and a sixth side positioned in the +Y direction when viewed from the center of the light emitting region Ha, are parallel to each other. Of each side of the light emitting region Ha, a third side located in the direction D when viewed from the center of the light emitting region Ha, and a seventh side positioned in the direction B when viewed from the center of the light emitting region Ha, are parallel to each other. Of each side of the light emitting region Ha, a fourth side located in the +X direction when viewed from the center of the light emitting region Ha, and an eighth side positioned in the −X direction when viewed from the center of the light emitting region Ha, are parallel to each other.

The contact region Ca included in the sub-pixel Px is located in the direction A as viewed from the light emitting region Ha included in the sub-pixel Px. Specifically, a contact region CaR included in the sub-pixel PxR is located in the direction A of the light emitting region HaR included in the sub-pixel PxR. A contact region CaG included in the sub-pixel PxG is located in the direction A of the light emitting region HaG included in the sub-pixel PxG. A contact region CaB1 included in the sub-pixel PxB1 is located in the direction A of the light emitting region HaB1 included in the sub-pixel PxB1. A contact region CaB2 included in the sub-pixel PxB2 is located in the direction A of the light emitting region HaB2 included in the sub-pixel PxB2.

The contact regions Ca are aligned along the direction A. A contact 7B1 is disposed in the contact region CaB1. A contact 7B2 is disposed in the contact region CaB2. An example of the contacts 7B1, 7B2 according to the present disclosure is a third relay electrode 71, which will be described below. A third pixel electrode 31, which will be described below, and a third reflection layer 52, which will be described below, are electrically coupled via the third relay electrode 71.

The contact 7R is disposed in the contact region CaR. A first pixel electrode 31, which will be described below, and a first reflection layer 52, which will be described below, are electrically coupled via a first relay electrode 71, which is an example of the contact 7R of the present disclosure. The contact 7G is disposed in the contact region CaG. A second pixel electrode 31, which will be described below, and a second reflection layer 52, which will be described below, are electrically coupled via a second relay electrode 71, which is an example of the contact. 7G of the present disclosure.

As illustrated in FIG. 4, the display unit 12 includes the color filters 81R, 81G, 81B as the color filter 81. The color filter 81R is disposed above the light emitting device 3R and overlaid with the sub-pixel PxR in a planar manner. The color filter 81G is disposed above the light emitting element 3G and overlaid with the sub-pixel PxG in a planar manner. The color filter BlB is disposed above the light emitting elements 3B1, 3B2 and overlaid with the sub-pixels PxB1, PxB2. The color filters 81R, BIG, 81B are rectangular and are disposed so as not to overlap with each other. The color filters 81R, 81G, 81B may be partially overlapped with each other.

As illustrated in FIG. 5, the color filter 81 adjacent to each sub-pixel PxR of the pixel. MPx1 to the pixel MPx4 in the +X direction is the color filter 81G. The color filter 81 adjacent to each sub-pixel PxG of the pixel MPx1 to the pixel MPx4 in the +X direction is the color filter 81R. The color filter 81 adjacent to each sub-pixel PxB of the MPx1 to the pixel MPx4 in the +X direction is the color filter 81B (not illustrated). The above relationship is the same in the −X direction as in the +X direction described above.

The color filter 81 adjacent to each sub-pixel PxR of the pixel MPx1 to the pixel MPx4 in the +Y direction is the color filter 81B. The color filter 81 adjacent to each sub-pixel PxG of the pixel MPx1 to the pixel MPx4 in the +Y direction is the color filter 81B. The color filter 81 adjacent to each sub-pixel PxB of the MPx1 to the pixel MPx4 in the +Y direction is the color filter 81R and the color filter 81G. The above relationship is the same in the −Y direction as in the +Y direction described above.

Figure 6:
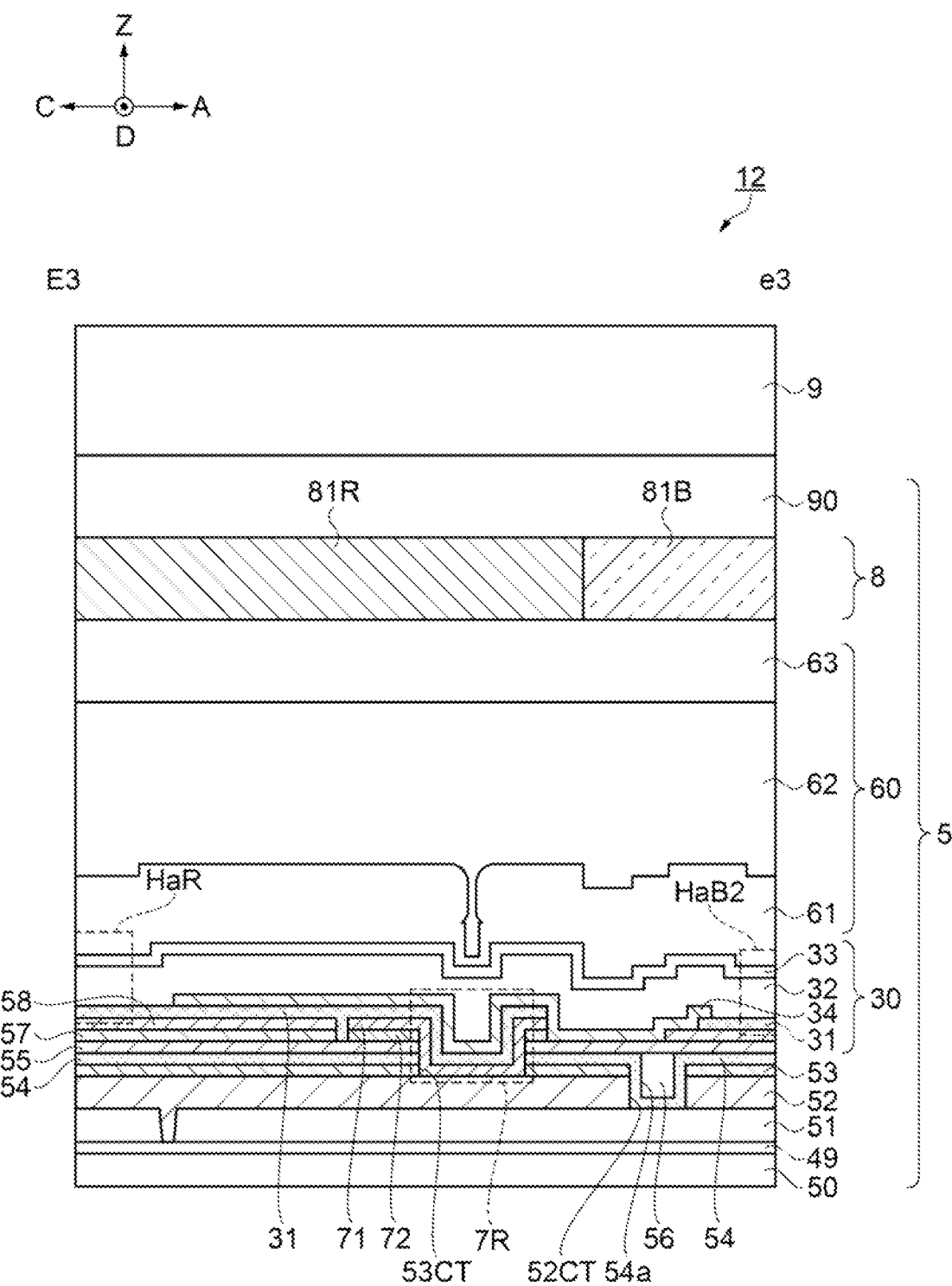
FIG. 6 is a cross-sectional view illustrating a configuration of the display unit.
Figure 7:
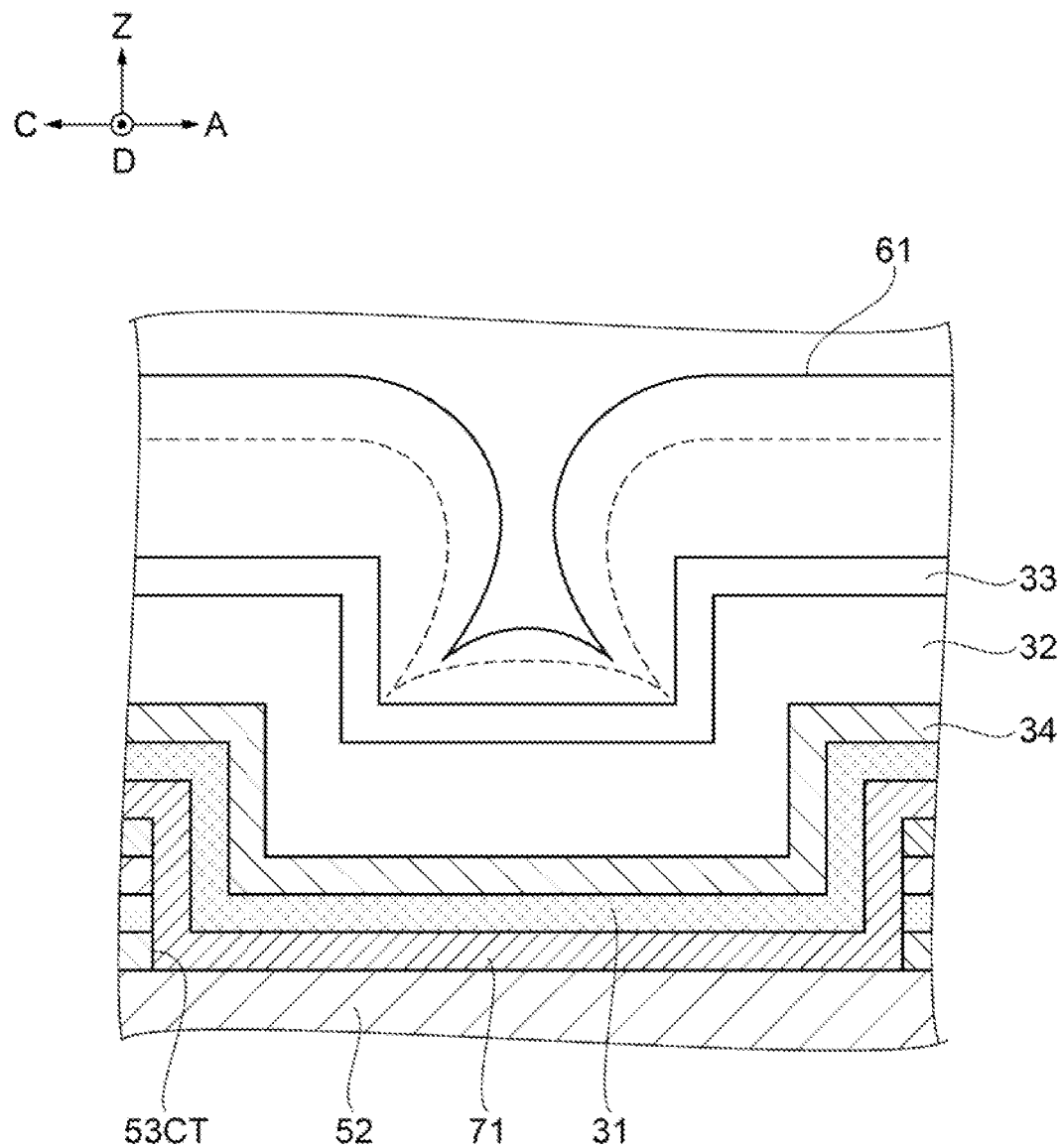
FIG. 7 is a schematic cross-sectional view illustrating sticking of a lower side sealing layer.
Figure 8:
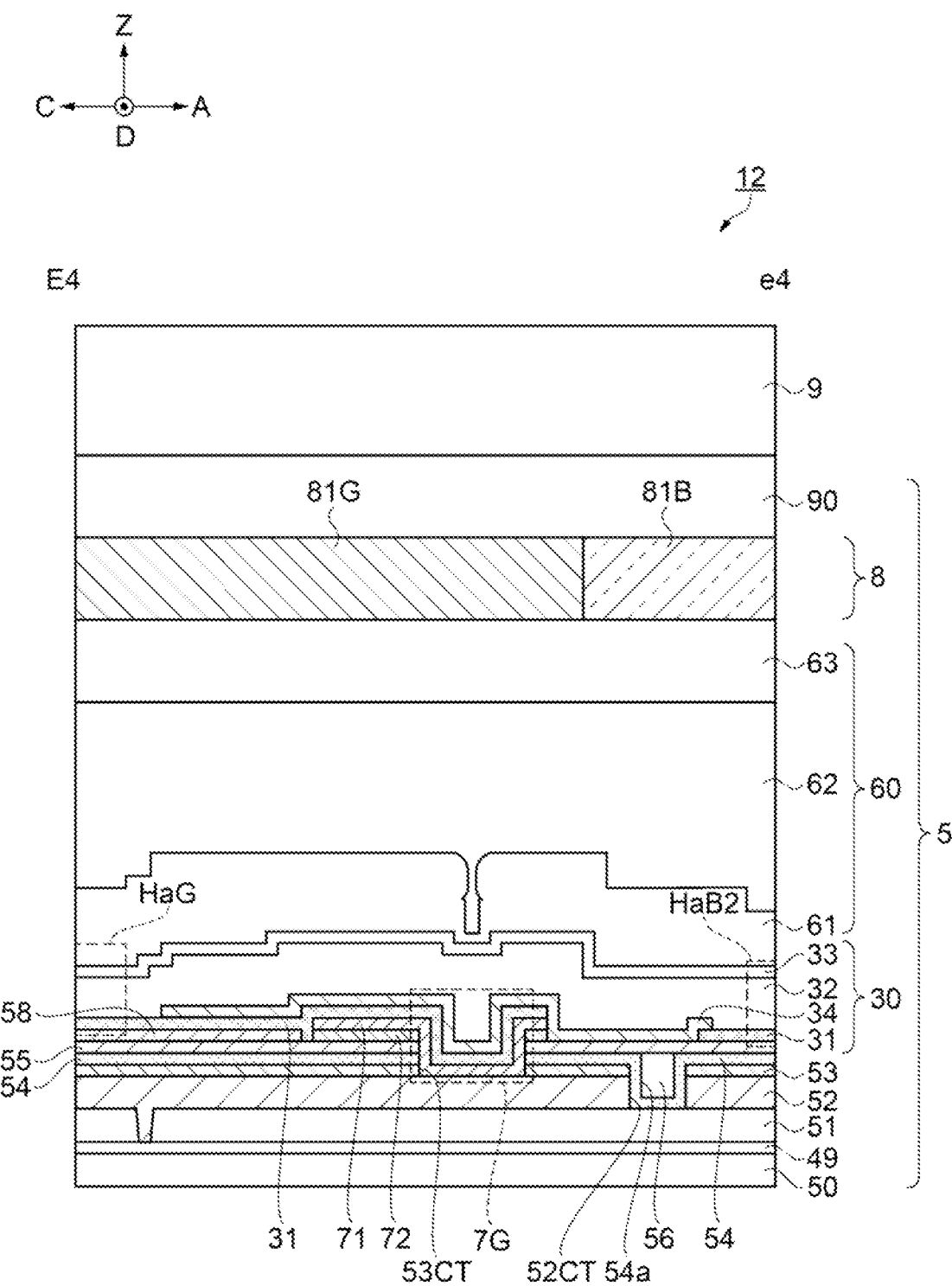
FIG. 8 is a cross-sectional view illustrating a configuration of the display unit.
Figure 9:
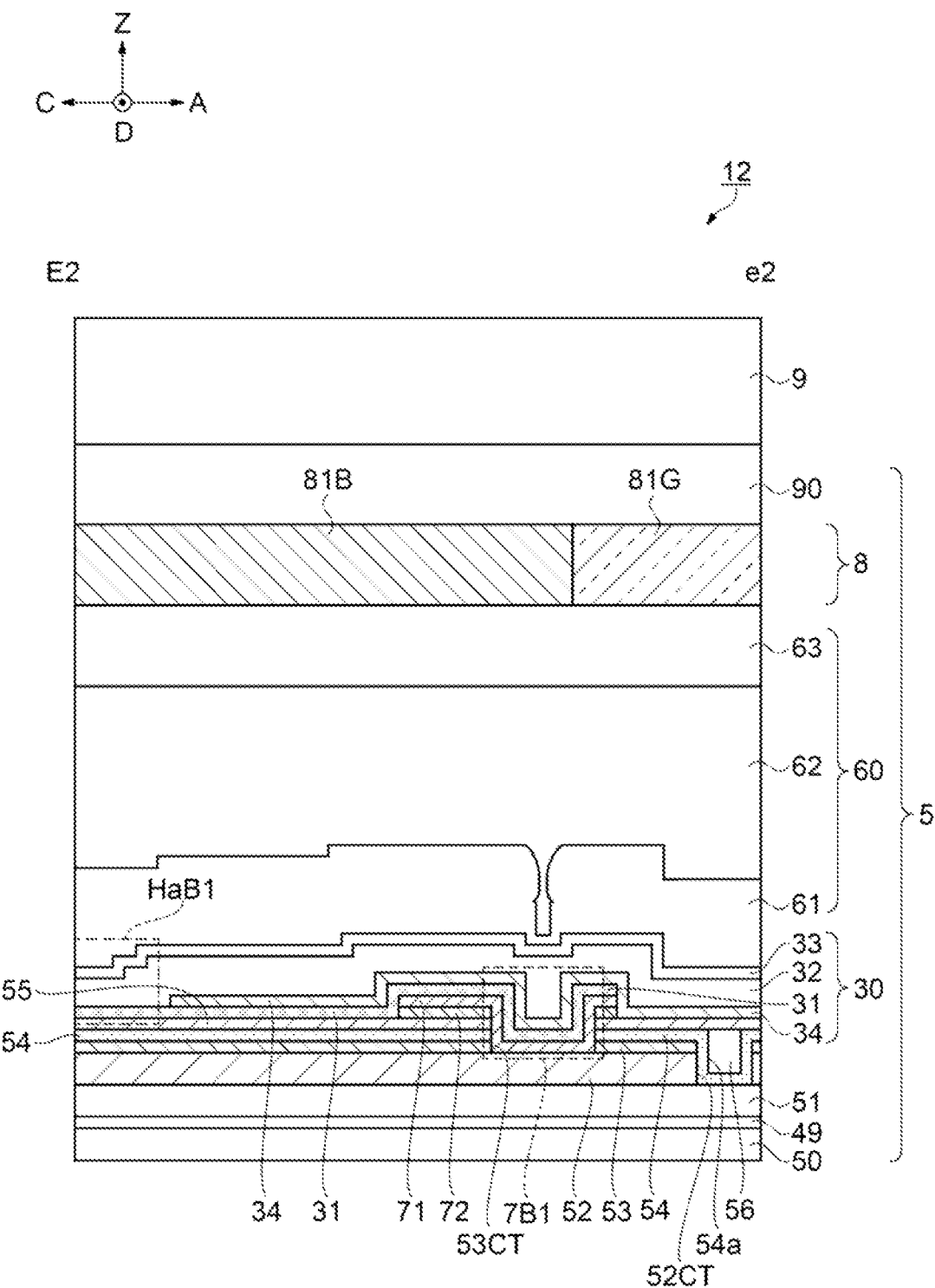
FIG. 9 is a cross-sectional view illustrating a configuration of the display unit.
Figure 14:
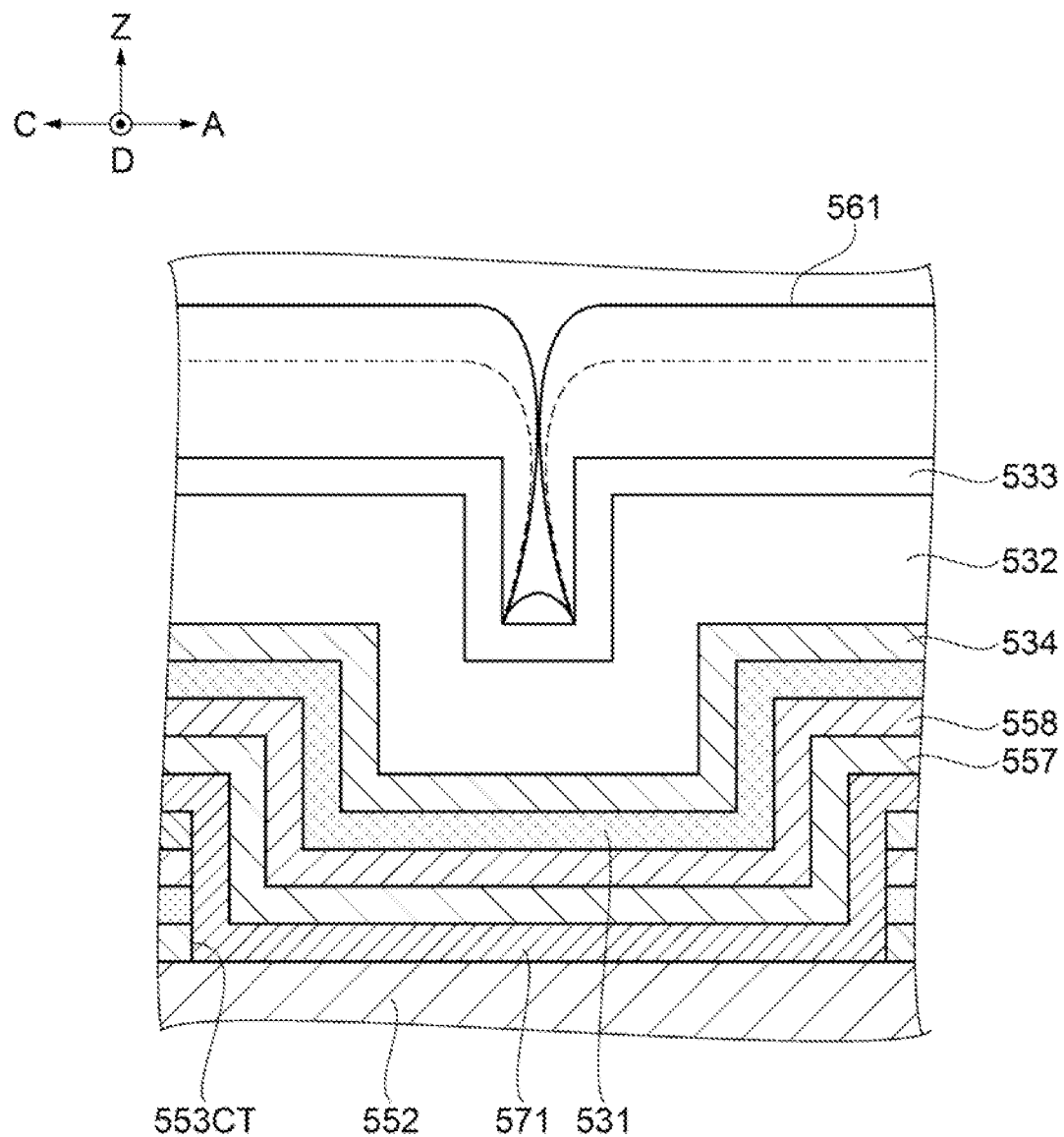
FIG. 14 is a schematic cross-sectional view illustrating sticking of a lower side sealing layer in the related art.

A cross-sectional configuration of the display unit 12 will be described with reference to FIGS. 6 to 9. Reference is also made to FIG. 14 to describe the sticking of the lower side sealing layer in the related art. FIG. 6 is a cross section orthogonal to the X-Y plane including the line segment E3-e3 of FIG. 4, including the contact 7R. In FIG. 7, the contact 7R and the region above the contact 7R and are enlarged. FIG. 8 is a cross section orthogonal to the X-Y plane including the line segment E4-e4 of FIG. 4, including the contact 7G. FIG. 9 is a cross section orthogonal to the X-Y plane including the line segment E2-e2 of FIG. 4, including the contact 7B1. FIG. 14 illustrates a region corresponding to FIG. 7 in the recent organic EL device.

Note that the description in FIG. 6 mainly describes the configuration of the sub-pixel PxR, the description in FIG. 8 mainly describes the configuration of the sub-pixel PxG, and the description in FIG. 9 mainly describes the configuration of the sub-pixel PxB1. The sub-pixel PxB2 has the same configuration as the sub-pixel PxB1, and thus descriptions thereof will be omitted. Furthermore, the reflection layer 52 provided at the sub-pixel PxP is a first reflection layer of the present disclosure, the reflection layer 52 provided at the sub-pixel PxG is a second reflection layer of the present disclosure, and the reflection layer 52 provided at each of the sub-pixels PxB1, PxB2 is a third reflection layer of the present disclosure.

As illustrated in FIG. 6, the display unit 12 includes an element substrate 5, a protective substrate 9, and an adhesive layer 90 provided between the element substrate 5 and the protective substrate 9. The organic EL device 1 assumes a top emission method in which light is emitted upward from the protective substrate 9.

The organic EL device 1 includes the counter electrode 33 as an electrode, the first reflection layer 52, the first pixel electrode 31, a light emitting layer 30, optical distance adjustment layers 57, 58 serving as first optical distance adjustment layers, and the first relay electrode 71 in the sub-pixel PxR of the display unit 12.

In the light emitting region HaR, the first reflection layer 52 is provided so as to be separate from the counter electrode 33 by a first optical distance. In other words, the first optical distance refers to a product of a distance in a direction along the Z-axis between a surface above the counter electrode 33 and a surface above the first reflection layer 52 in the light emitting region. HaR, and the refractive index therebetween.

The first pixel electrode 31 is provided between the counter electrode 33 and the first reflection layer 52. The light emitting layer 30 is provided between the counter electrode 33 and the first pixel electrode 31. The optical distance adjustment layers 57, 58 are provided between the first pixel electrode 31 and the first reflection layer 52. The first relay electrode 71 is provided between the first pixel electrode 31 and the first reflection layer 52, and electrically couples the first pixel electrode 31 and the first reflection layer 52.

The optical distance adjustment layers 57, 58 are provided so as to be separate from the first relay electrode 71. That is, the optical distance adjustment layers 57, 58 are not provided in a region that overlaps with the contact portion where the first relay electrode 71 and the first reflection layer 52 come into contact in plan view.

The adhesive layer 90 is a transparent resin layer that adheres the element substrate 5 and the protective substrate 9. The adhesive layer 90 is formed from a transparent resin material such as, for example, an epoxy-based resin. The protective substrate 9 is a transparent substrate disposed above the adhesive layer 90. The protective substrate 9 protects a member such as the color filter 81 disposed below the protective substrate 9. A quartz substrate is employed as the protective substrate 9, for example.

The element substrate 5 includes a substrate 50, a circuit layer 49 formed at the substrate 50, an interlayer insulating layer 51 laminated above the circuit layer 49, a reflection layer 52, a hyper-reflection layer 53, a first insulating layer 54 as a protective layer, a second insulating layer 55 as a protective layer, the first relay electrode 71, a third insulating layer 72 as a protective layer, the optical distance adjustment layers 57, 58, the pixel electrode 31, the light emitting layer 30, a sealing layer 60, and a color filter layer B. As described in detail below, the light emitting layer 30 includes the light emitting device 3R described above. The light emitting element 3 emits light upward and downward. The color filter layer 8 includes the color filter 81.

A substrate capable of implementing various wiring and various circuits is employed for the substrate 50. Specifically, for the substrate 50, for example, a silicon substrate, a quartz substrate, a glass substrate, etc. can be employed. The circuit layer 49 is formed at the substrate 50. The circuit layer 49 includes various circuits such as the scanning lines 13 and the data lines 14 described above, the driving circuit 11, and the pixel circuit 100. The interlayer insulating layer 51 is laminated above the circuit layer 49.

An insulating material such as silicon oxide, for example, is employed for the interlayer insulating layer 51. The reflection layer 52 is laminated above the interlayer insulating layer 51. The reflection layer 52 reflects light emitted from the light emitting element 3 of the light emitting layer 30 upward. A film including aluminum and a copper alloy above the titanium layer, for example, is employed for the reflection layer 52. The reflection layer 52 is a conductive layer having reflective properties with respect to the light, and is formed in discrete islands for each sub-pixel Px.

The hyper-reflection layer 53 is disposed covering a surface above the reflection layer 52, and has a function of enhancing the light reflective properties of the reflection layer 52. For example, silicon oxide, which is an insulating material having light transmittance, is employed for the hyper-reflection layer 53.

The first insulating layer 54 as a protective layer is provided at a surface above the hyper-reflection layer 53. The first insulating layer 54 is also provided inside a gap 52 CT provided at the reflection layer 52. As such, the first insulating layer 54 has a recessed portion 54a corresponding to the recess of the gap 52 CT. An embedded insulating film 56 is formed to fill the inside of the recessed portion 54a. The second insulating layer 55 is provided as a protective layer over the first insulating layer 54 and the embedded insulating film 56. For example, silicon nitride is employed for the first insulating layer 54 and the second insulating layer 55.

A gap 53 CT is provided at a position corresponding to the contact 7R in a planar manner. The gap 53 CT extends through the hyper-reflection layer 53, the first insulating layer 54, the second insulating layer 55, and the third insulating layer 72 as a protective layer to be described below. As will be described in greater detail below, the first relay electrode 71, the first pixel electrode 31, etc. are provided inside the gap 53 CT.

The optical distance adjustment layers 57, 58, the third insulating layer 72, and the pixel separation layer 34 are disposed above the second insulating layer 55 as a protective layer. Specifically, the optical distance adjustment layers 57, 58 are provided in a region including the light emitting region HaR in the direction C with respect to the gap 53 CT. The optical distance adjustment layer 57 is provided at a surface above the second insulating layer 55, and the optical distance adjustment layer 58 is laminated at a surface above the optical distance adjustment layer 57. The third insulating layer 72 and the first relay electrode 71 are disposed in the direction A of the optical distance adjustment layers 57, 58.

The optical distance adjustment layer 57 and the third insulating layer 72 are disposed so that the positions thereof in the direction along the Z-axis are substantially equal. The optical distance adjustment layer 58 and an end portion in the direction C of the first relay electrode 71 are disposed so that the positions thereof in the direction along the Z-axis are substantially equal. An end portion in the direction A of the optical distance adjustment layers 57, 58 and end portions in the direction C of the third insulating layer 72 and the first relay electrode 71 are separated by a portion of the first pixel electrode 31 extending to the lower second insulating layer 55. In other words, the optical distance adjustment layers 57, 58 are provided so as to be separate from the first relay electrode 71. In other words, in plan view, the first relay electrode 71 does not overlap with the optical distance adjustment layers 57, 58, and the end portion in the direction A of the optical distance adjustment layers 57, 58 is disposed between the light emitting region HaR where the first pixel electrode 31 and the light emitting layer 30 come into contact, and the first relay electrode 71.

Thus, in the region where the first relay electrode 71 and the first pixel electrode 31 come into contact, the first relay electrode 71 and the optical distance adjustment layers 57, 58 are separated. As a result, a step between the light emitting region HaR and the contact region CaR is reduced. Since the step is reflected by a step of the lower side sealing layer 61 formed above, the step reduction helps to reduce the step of the lower side sealing layer 61. Furthermore, in the lower side sealing layer 61, cracking caused by the step of the lower side sealing layer 61 is suppressed, whereby the sealing performance of the lower side sealing layer 61 can be further improved.

In addition, the end portion in the direction A of the optical distance adjustment layers 57, 58 is separated from the end portion in the direction C of the first relay electrode 71. That is, the end portion in the direction A of the optical distance adjustment layers 57, 58 does not ride up at the end portion in the direction C of the first relay electrode 71. Therefore, the step generated between the lower side sealing layer 61 above the end portion in the direction A of the light emitting region HaR and the lower side sealing layer 61 above the end portion in the direction C of the pixel separation layer 34 becomes smaller. When the step is large, light may be emitted in the direction A further than the end portion in the direction A of the light emitting region HaR, but this reduction makes it possible to suppress this unnecessary light emission. In other words, the occurrence of color shifting in the organic EL device 1 can be reduced.

The optical distance adjustment layers 57, 58 have functions to adjust the optical distance between the counter electrode 33 and the reflection layer 52 for each sub-pixel PxR, PxG, PxB. The optical distance adjustment layers 57, 58 as the first optical distance adjustment layers are provided at the sub-pixel PxR. The optical distance adjustment layer 58 as a second optical distance adjustment layer is provided at the sub-pixel PxG. None of the optical distance adjustment layers 57, 58 are provided at the sub-pixels PxB1, PxB2.

In the present exemplary embodiment, the optical distance adjustment layers 57, 58 are insulating layers including silicon oxide. As a result, light transmittance and insulating properties are imparted to the optical distance adjustment layers 57, 58. Note that the optical distance adjustment layers 57, 58 are not limited to being an insulating layer.

The third insulating layer 72 is provided over the second insulating layer 55 around the gap 53 CT. An insulating material such as silicon oxide is employed for the third insulating layer 72. Here, the first insulating layer 54, the second insulating layer 55, and the third insulating layer 72, which are protective layers, and the optical distance adjustment layers 57, 58, are common in that they are transparent layers disposed between the reflection layer 52 and the pixel electrode 31, whereas each function thereof is different. The protective layer including the first insulating layer 54, the second insulating layer 55, and the third insulating layer 72 is provided in common at sub-pixels PxR, PxG, PxB1, PxB2 to protect the contact 7, etc. In contrast, the optical distance adjustment layers 57, 58 are selectively disposed in accordance with the color of each sub-pixel Px to form a light resonance structure.

The first relay electrode 71 is provided over the third protective layer 72 and inside the gap 53 CT. Thus, the first relay electrode 71 contacts and is electrically coupled to the first reflection layer 52 at the bottom portion of the gap 53 CT. In the present exemplary embodiment, in order to make the electrical coupling between the first relay electrode 71 and the first reflection layer 52 more reliable, the width of the gap 53 CT, that is, the width at which the first relay electrode 71 and the first reflection layer 52 come into contact in the direction A and the direction C is made larger than before. A conductive material such as tungsten, titanium, titanium nitride, etc., for example, is employed for the first relay electrode 71.

The light emitting layer 30 has the pixel electrode 31, the pixel separation layer 34, the light emitting functional layer 32 covering the upper portion of the pixel electrode 31 and the pixel separation layer 34, etc., and the counter electrode 33 laminated above the light emitting functional layer 32.

The pixel electrode 31 is a transparent layer having electrical conductivity, and is formed in discrete islands for each sub-pixel Px. The first pixel electrode 31 is disposed above the first relay electrode 71 including an inner side of the gap 53 CT, and above the optical distance adjustment layers 57, 58 in the direction C of the gap 53 CT. The first pixel electrode 31 contacts and is electrically coupled to the first relay electrode 71 above the first relay electrode 71 including the inner side of the gap 53 CT. As a result, the first reflection layer 52 and the first pixel electrode 31 are electrically coupled via the first relay electrode 71.

In addition, as described above, the first pixel electrode 31 is provided to separate the end portion in the direction A of the optical distance adjustment layers 57, 58 and the end portion in the direction C of the first relay electrode 71. The first pixel electrode 31 is disposed across the light emitting region HaR, and an end portion in the direction A of the pixel electrode 31 is located in the direction C further than the recessed portion 54a. For the first pixel electrode 31, for example, a conductive transparent material such as ITO (Indium Tin Oxide) or IZO (Indium Zinc Oxide) is employed.

The pixel separation layer 34 is provided covering a peripheral portion, etc. of the first pixel electrode 31, excluding the upper portion of the light emitting region HaR. Specifically, the pixel separation layer 34 has an end portion in the direction A at a boundary portion of the light emitting region HaB1, and an end portion in the direction C in the vicinity of the light emitting region HaR. The pixel separation layer 34 covers an upper portion of a peripheral portion of the first pixel electrode 31 including the inner side of the gap 53 CT, an end portion of the first pixel electrode 31 in the direction A of the first relay electrode 71, and an upper portion of the second insulating layer 55 in the direction A of the gap 53 CT, etc. The pixel separation layer 34 divides a plurality of pixels Px provided at the display unit 12 to each other in a planar manner. An insulating material such as silicon oxide is employed for the pixel separation layer 34 which electrically insulates between adjacent light emitting elements 3.

Although not illustrated, the light emitting functional layer 32 includes a hole injecting layer, a hole transport layer, an organic light emitting layer, and an electron transport layer. The light emitting functional layer 32 is provided over the pixel electrode 31 and the pixel separation layer 34 in a flattened state over the plurality of sub-pixels Px. Since the light emitting functional layer 32 is provided to fill the inner side of the gap 53 CT, the shape of the inward-facing recess in the gap 53 CT is reflected in the light emitting functional layer 32. Thus, in the light emitting functional layer 32, a recess is formed at a position corresponding to the gap 53 CT in a planar manner.

The light emitting functional layer 32 emits white light by supplying the hole from a region where the upper portion of the pixel electrode 31 is not covered by the pixel separation layer 34. The white light emitted from the light emitting element 3 is light including red light, green light, and blue light. Note that in the present specification, a structure included in the region including the light emitting region Ha and the contact region Ca is regarded as the sub-pixel Px in plan view.

The counter electrode 33 is provided over the light emitting functional layer 32 in a flattened state over the plurality of sub-pixels Px. The counter electrode 33 has light transmittance, light reflectivity, and conductivity. A recess corresponding to the recess in the gap 53 CT occurs at a surface above the counter electrode 33. A conductive material such as, for example, an alloy of magnesium and silver is employed for the counter electrode 33.

In the organic EL device 1, the optical resonance structure is formed between the reflection layer 52 and the counter electrode 33 due to the arrangement of the optical distance adjustment layers 57, 58. Therefore, light emitted from the light emitting functional layer 32 is repeatedly reflected between the reflection layer 52 and the counter electrode 33. As a result, the light is emitted upward through the counter electrode 33 by increasing the intensity thereof of the wavelength corresponding to the optical distance between the reflection layer 52 and the counter electrode 33.

In the present exemplary embodiment, the thickness and arrangement of the optical distance adjustment layers 57, 58, for example, increase the intensity of light at a wavelength of 610 nm for the sub-pixel PxR, the intensity of light at a wavelength of 540 nm for the sub-pixel PxG, and the intensity of light at a wavelength of 470 nm for the sub-pixels PxB1, PxB2, although not particularly limited. As a result, red light with a maximum luminance of light having a wavelength of 610 nm is emitted from the sub-pixel PxR, green light with a maximum luminance of light having a wavelength of 540 nm is emitted from the sub-pixel PxG, and blue light with a maximum luminance of light having a wavelength of 470 nm is emitted from the sub-pixels PxB1, PxB2.

The sealing layer 60 is provided over the counter electrode 33 in a flattened state over the plurality of sub-pixels Px. The sealing layer 60 has the lower side sealing layer 61, a flattening layer 62, and an upper side sealing layer 63. In the sealing layer 60, the lower side sealing layer 61, the flattening layer 62, and the upper side sealing layer 63 are laminated in this order from the counter electrode 33 upward. The lower side sealing layer 61 and the upper side sealing layer 63 are transparent layers having insulating properties, and inhibit ingress of moisture, oxygen, etc. into the light emitting layer 30. For example, silicon oxynitride is employed for the lower side sealing layer 61 and the upper side sealing layer 63. The flattening layer 62 is a transparent layer that flattens the unevenness corresponding to the underlying component. A transparent resin material such as an epoxy-based resin, for example, is employed for the flattening layer 62.

Here, the sticking of the lower side sealing layer 61 at the time of formation will be described by comparing the organic EL device 1 with the recent organic EL device. In the organic EL device of the related art illustrated in FIG. 14, similarly to the organic EL device 1 of the present exemplary embodiment, the width of the contact surfaces in the direction A and the direction C are increased in order to make the electrical coupling between a reflection layer 552 and a first relay electrode 571 more reliable. In FIGS. 7 and 14, the surface of the lower side sealing layer 61, 561 is represented by a solid line, and the surface during formation of the lower side sealing layer 61, 561 is represented by a dashed line.

As illustrated in FIG. 14, in the contact 7R of the recent organic EL device, the first relay electrode 571 and the reflection layer 552 are electrically coupled. The first relay electrode 571 and the pixel electrode 531 are electrically coupled by being in contact with each other at another position in the direction C (not illustrated).

The first relay electrode 571 is provided along the inner side of a gap 553 CT. As a result, a recess is formed in the first relay electrode 571. Optical distance adjustment layers 557, 558, the pixel electrode 531, a pixel separation layer 534, a light emitting functional layer 532, and a counter electrode 533 are laminated in this order on the upper side including the recess of the first relay electrode 571. The shape of the recess in the first relay electrode 571 is reflected to the counter electrode 533, and a recess is also formed at the counter electrode 533.

Although the width of the contact surface between the first relay electrode 571 and the reflection layer 552 is enlarged, each layer described above is provided inside the recess of the first relay electrode 571. Therefore, the recess formed in the counter electrode 533 has a narrow width. Then, when the lower side sealing layer 561 is formed by a gas phase method such as vapor deposition, the forming material of the lower side sealing layer 561 adheres to the overhang state during formation. As a result, the upper portion of the recess becomes occluded, and the sticking become worse, and the forming material is less likely to be deposited on the bottom portion of the recess. As a result, the thickness of the lower side sealing layer 561 at the bottom portion of the recess of the counter electrode 533 becomes thinner, and it is difficult to improve the sealing performance.

In addition, although not illustrated in the drawings, in the recent organic EL device, the optical distance adjustment layer is provided inside the recess in the contact 7G of the sub-pixel PxG, so it is difficult to improve the sealing performance in the same manner as the recent contact 7R. Note that, even in the recent organic EL device, it is possible to improve the sticking by further enlarging the width of the recess in the contacts 7R, 7G, but there was a limit to widening the contacts 7R, 7G due to restrictions on the density and arrangement of the sub-pixel Px.

In contrast, as illustrated in FIG. 7, in the present exemplary embodiment, the pixel electrode 31, the pixel separation layer 34, the light emitting functional layer 32, and the counter electrode 33 are laminated in this order on the upper side including the recess of the first relay electrode 71. Since the optical distance adjustment layers 57, 58 are not provided inside the recess of the first relay electrode 71, the recess occurred in the counter electrode 33 is wider than in the related art. Therefore, even when the lower side sealing layer 61 is formed by a vapor phase method such as vapor deposition, the upper portion of the recess becomes less likely to be occluded during formation, and the thickness of the lower side sealing layer 61 at the bottom portion of the recess becomes thicker. As a result, the sealing performance can be further improved than the related art.

Note that, although not illustrated, in the present exemplary embodiment, the contact 7G of the sub-pixel PxG also has the same form as the contact 7R described above. As a result, the sticking of the lower side sealing layer 61, compared to the related art, is improved in the sub-pixel PxG, and the sealing performance is improved.

Returning to FIG. 6, the color filter layer 8 is disposed above the upper side sealing layer 63. The color filter layer 8 includes the color filters 81R, 81B, and the color filter 81G (not illustrated). The color filter 81R has a function of transmitting red light, the color filter 81G has a function of transmitting green light, and the color filter 81B has a function of transmitting blue light. The color filter 81 is formed, for example, by applying a photosensitive resin including a pigment capable of exhibiting each function and then patterning. The protective substrate 9 is disposed above the color filter layer 8 via the adhesive layer 90.

As illustrated in FIG. 8, the organic EL device 1 includes the counter electrode 33 as an electrode, the second reflection layer 52, the second pixel electrode 31, the light emitting layer 30, the optical distance adjustment layer 58 serving as the second optical distance adjustment layer, and the second relay electrode 71 in the sub-pixel PxG of the display unit 12. Note that the configuration of the sub-pixel PxG is described only for a configuration different from that of the sub-pixel PxR, and descriptions thereof are omitted using the same reference signs as those of the sub-pixel PxR.

In the light emitting region HaG, the second reflection layer 52 is provided so as to be separate from the counter electrode 33 by a second optical distance. In other words, the second optical distance refers to a product of a distance in a direction along the Z-axis between a surface above the counter electrode 33 and a surface above the second reflection layer 52 in the light emitting region HaG, and the refractive index therebetween. The second optical distance is shorter than the first optical distance in the light emitting region HaR.

The second pixel electrode 31 is provided between the counter electrode 33 and the second reflection layer 52. The light emitting layer 30 is provided between the counter electrode 33 and the second pixel electrode 31. The second relay electrode 71 is provided between the second pixel electrode 31 and the second reflection layer 52, and electrically couples the second pixel electrode 31 and the second reflection layer 52.

The optical distance adjustment layer 58 is provided between the second pixel electrode 31 and the second reflection layer 52, and no optical distance adjustment layer 57 is provided. That is, the second optical distance adjustment layer of the sub-pixel PxG is thinner than the first optical distance adjustment layer of the sub-pixel PxR. The optical distance adjustment layer 58 is provided so as to be separate from the second relay electrode 71. The optical distance adjustment layer 58 is not provided in a region that overlaps with the contact portion where the second relay electrode 71 and the second reflection layer 52 come into contact in plan view. In other words, in plan view, the second relay electrode 71 does not overlap with the optical distance adjustment layer 58, and the end portion in the direction A of the optical distance adjustment layer 58 is disposed between the light emitting region HaG where the second pixel electrode 31 and the light emitting layer 30 come into contact, and the second relay electrode 71.

As a result, in the region where the second relay electrode 71 and the second pixel electrode 31 come into contact, the second relay electrode 71 and the optical distance adjustment layer 58 are separated. Therefore, a step between the light emitting region HaG and the contact 7G is reduced. Since the step is reflected by a step of the lower side sealing layer 61 formed above, the step reduction helps to reduce the step of the lower side sealing layer 61. Furthermore, in the lower side sealing layer 61, cracking caused by the step of the lower side sealing layer 61 is suppressed, whereby the sealing performance of the lower side sealing layer 61 can be further improved.

In addition, the end portion in the direction A of the optical distance adjustment layer 58 is separated from the end portion in the direction C of the second relay electrode 71. That is, the end portion in the direction A of the optical distance adjustment layer 58 does not ride up at the end portion in the direction C of the second relay electrode 71. Therefore, the step generated between the lower side sealing layer 61 above the end portion in the direction A of the light emitting region HaG and the lower side sealing layer 61 above the end portion in the direction C of the pixel separation layer 34 becomes smaller. When the step is large, light may be emitted in the direction A further than the end portion in the direction A of the light emitting region HaG, but this reduction makes it possible to suppress this unnecessary light emission. In other words, the occurrence of color shifting in the organic EL device 1 can be reduced.

As illustrated in FIG. 9, the organic EL device 1 includes the counter electrode 33 as an electrode, the third reflection layer 52, the third pixel electrode 31, the light emitting layer 30, and the third relay electrode 71 in the sub-pixel PxB1 of the display unit 12. The sub-pixels PxB1, PxB2 do not have the optical distance adjustment layer. Note that the configuration of the sub-pixel PxB1 is described only for a configuration different from that of the sub-pixel PxR, and descriptions thereof are omitted using the same reference signs as those of the sub-pixel PxR.

In the light emitting region HaB1, the third reflection layer 52 is provided so as to be separate from the counter electrode 33 by a third optical distance. In other words, the third optical distance refers to a product of a distance in a direction along the Z-axis between a surface above the counter electrode 33 and a surface above the third reflection layer 52 in the light emitting region HaB1, and the refractive index therebetween. The third optical distance is shorter than the second optical distance in the light emitting region HaG.

The third pixel electrode 31 is provided between the counter electrode 33 and the third reflection layer 52. The light emitting layer 30 is provided between the counter electrode 33 and the third pixel electrode 31. The third relay electrode 71 is provided between the third pixel electrode 31 and the third reflection layer 52. The third relay electrode 71 electrically couples the third pixel electrode 31 and the third reflection layer 52.

As described above, in the sub-pixel PxR, the optical distance adjustment layers 57, 58 are provided in a region including the light emitting region HaR, and the optical distance adjustment layers 57, 58 are not provided in a region overlapping with the first relay electrode 71 in plan view. Further, in the sub-pixel PxG, the optical distance adjustment layer 58 is provided in a region including the light emitting region HaG, and the optical distance adjustment layer 58 is not provided in a region overlapping with the second relay electrode in plan view. Furthermore, no optical distance adjustment layer is provided at the sub-pixels PxB1, PxB2. Thus, the distance between the first reflection layer 52 and the counter electrode 33 in the region where the first relay electrode 71 is provided, the distance between the second reflection layer 52 and the counter electrode 33 in the region where the second relay electrode 71 is provided, and the distance between the third reflection layer 52 and the counter electrode 33 in the region where the third relay electrode 71 is provided, are equal.

As a result, the inside of the contacts 7R, 7B is widened, and the width of the recess formed in the corresponding upper light emitting layer 30 also widens. As a result, when the lower side sealing layer 61 is formed by vapor deposition, the thickness of the lower side sealing layer 61 can be increased by improving the sticking.

According to the present exemplary embodiments, the following advantages can be obtained.

Sealing performance can be improved above the first relay electrode 71. Specifically, in the sub-pixel PxF, the first relay electrode 71 and the optical distance adjustment layers 57, 58 are disposed separately from each other, and the optical distance adjustment layers 57, 58 are not disposed on the inner side of the contact 7R between the first relay electrode 71 and the first reflection layer 52. As a result, the inside of the contact 7R is widened, and the width of the recess formed in the upper light emitting layer 30 also widens. As a result, when the lower side sealing layer 61 is formed on the upper side of the light emitting layer 30 by vapor deposition, the thickness of the lower side sealing layer 61 is ensured by improving the sticking. As a result, the organic EL device 1 that improves the sealing performance above the contact 7R at the first relay electrode 71 can be provided.

Sealing performance can be improved above the second relay electrode 71. Specifically, in the sub-pixel PxG, the second relay electrode 21 and the optical distance adjustment layer 58 are disposed separately from each other, and the optical distance adjustment layer 58 is not disposed on the inner side of the contact 7G between the second relay electrode 71 and the second reflection layer 52. As a result, the inside of the contact 7G is widened, and the width of the recess formed in the upper light emitting layer 30 also widens. As a result, when the lower side sealing layer 61 is formed on the upper side of the light emitting layer 30 by vapor deposition, the thickness of the lower side sealing layer 61 is ensured by improving the sticking. As a result, the organic EL device 1 that improves the sealing performance above the contact 7G at the second relay electrode 71 can be provided.

2. Second Exemplary Embodiment

In the present exemplary embodiment, as in the first exemplary embodiment, an organic EL device is exemplified as an electro-optical device. The light emitting device is also suitably used in the HMD described below. The organic EL device according to the present exemplary embodiment differs from the organic EL device 1 of the first exemplary embodiment in the material of the first optical distance adjustment layer and the second optical distance adjustment layer. In addition, the same components as in the first exemplary embodiment are given the same reference signs, and redundant descriptions of these components will be omitted.

Figure 10:
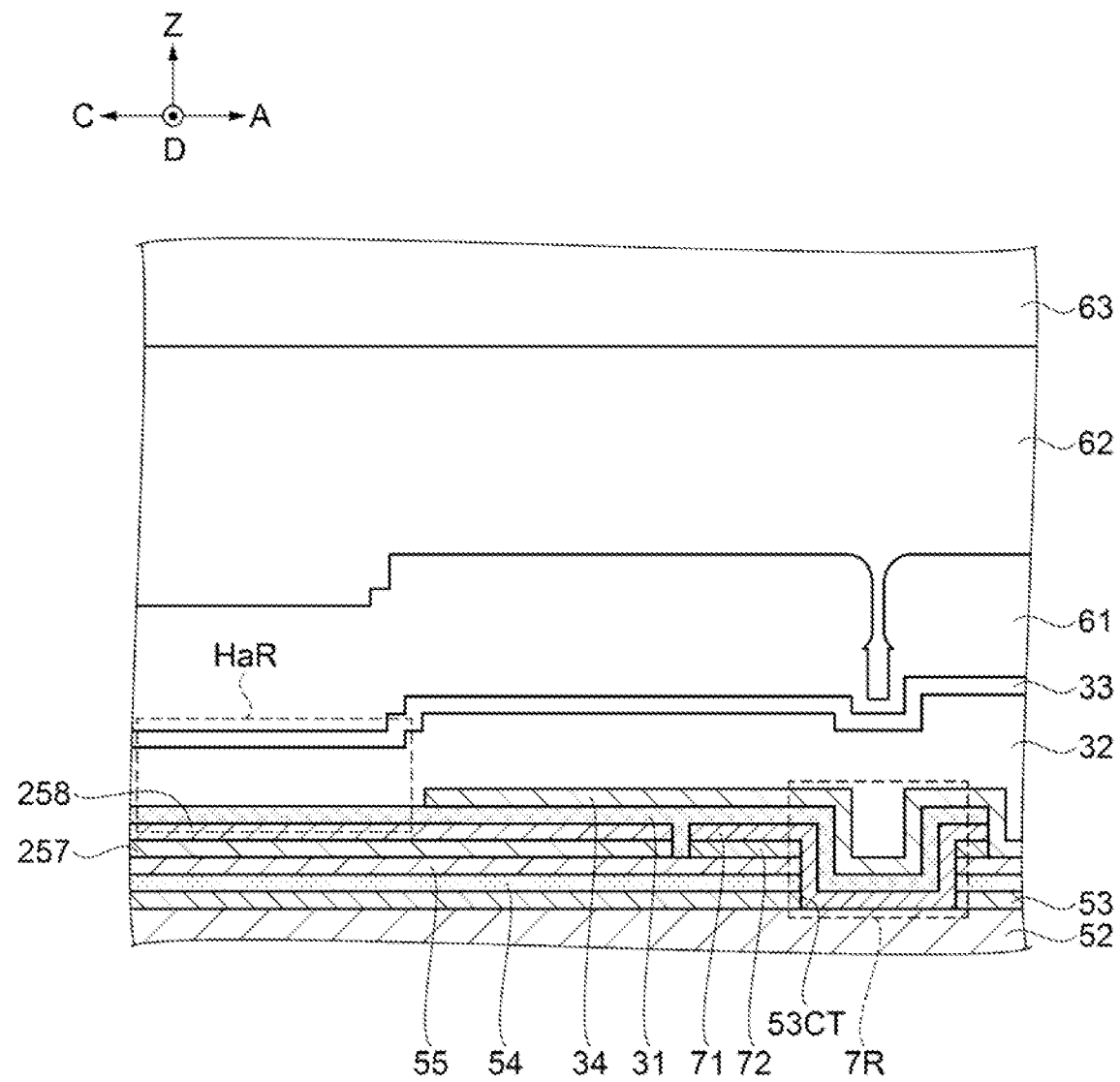
FIG. 10 is a cross-sectional view illustrating a configuration of a display unit according to a second exemplary embodiment.
Figure 11:
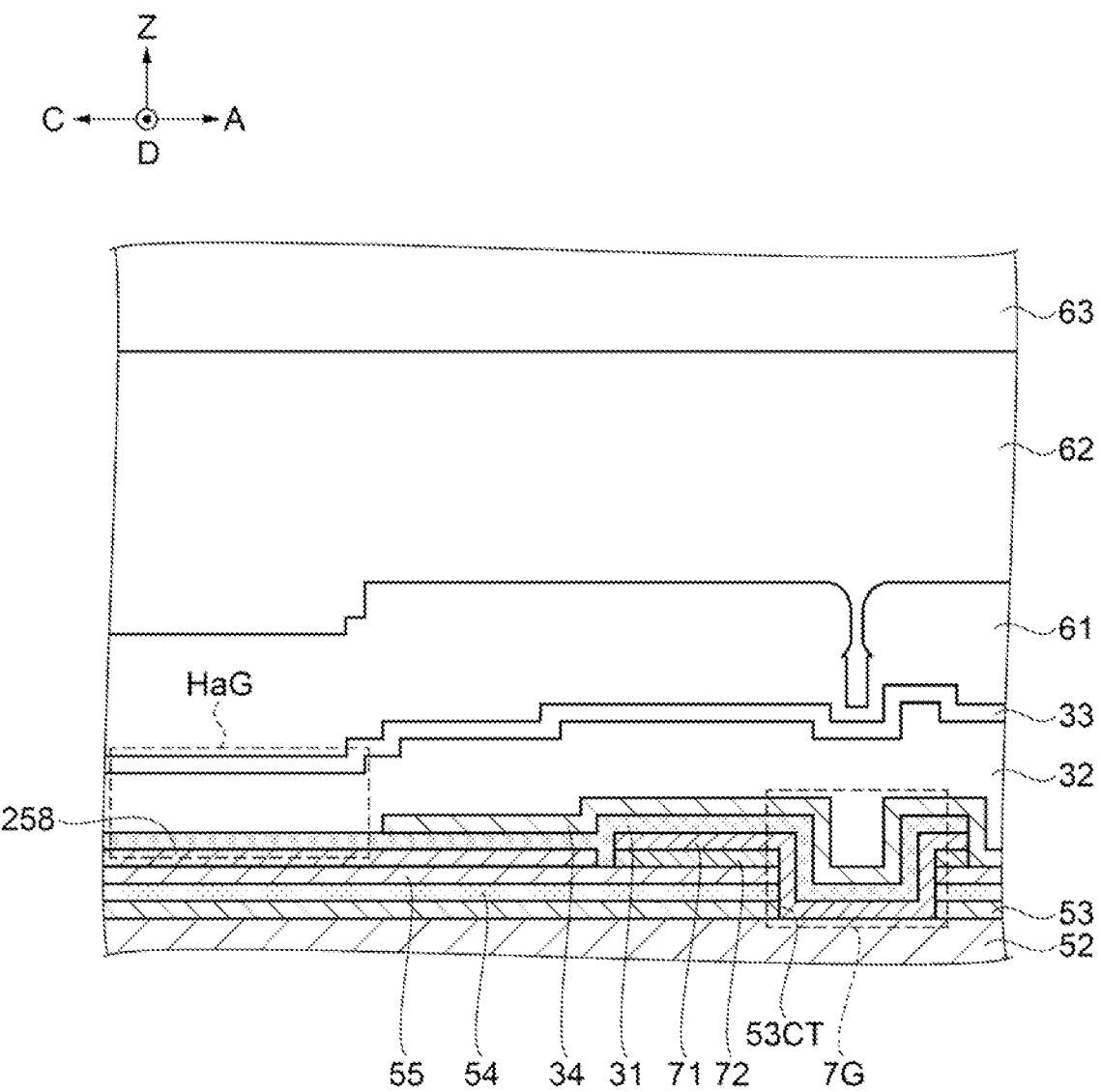
FIG. 11 is a cross-sectional view illustrating a configuration of the display unit.

The configurations of the first optical distance adjustment layer and the second optical distance adjustment layer in the organic EL device of the present exemplary embodiment will be described with reference to FIGS. 10 and 1. In FIG. 10, the region corresponding to contact 7R in FIG. 6 of the first exemplary embodiment is enlarged. In FIG. 11, the region corresponding to contact 7G in FIG. 8 of the first exemplary embodiment is enlarged. Note that the description of FIG. 10 describes a configuration of the sub-pixel ExR, and the description in FIG. 11 describes a configuration of the sub-pixel PxG.

As illustrated in FIG. 10, as the first optical distance adjustment layer, optical distance adjustment layers 257, 258 are provided at the sub-pixel PxR. The planar and cross-sectional arrangement of the optical distance adjustment layer 257, 258 is the same as the optical distance adjustment layers 57, 58 of the first exemplary embodiment. The optical distance adjustment layers 257, 258 are transparent conductive layers that include the same material as the first pixel electrode. Specifically, ITO, IZO, etc., for example, are employed for the optical distance adjustment layers 257, 258.

As illustrated in FIG. 11, as the second optical distance adjustment layer, the optical distance adjustment layer 258 is provided is provided at the sub-pixel PxG. The planar and cross-sectional arrangement of the optical distance adjustment layer 258 is the same as the optical distance adjustment layer 58 of the first exemplary embodiment.

The present exemplary embodiment can achieve a similar effect to the first exemplary embodiment.

3. Third Exemplary Embodiment

An example of an electronic apparatus according to the present exemplary embodiment illustrates a head-mounted display and a personal computer.

Figure 12:
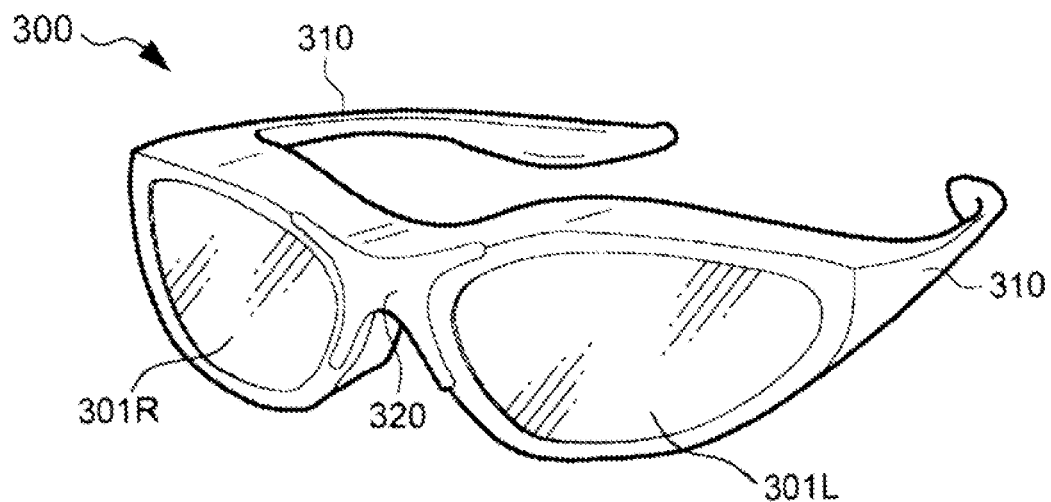
FIG. 12 is a perspective view illustrating an appearance of a head-mounted display as an electronic apparatus according to an exemplary third embodiment.

As illustrated in FIG. 12, a head-mounted display 300 as an electronic apparatus of the present exemplary embodiment includes a temple 310, a bridge 320, and projection optical systems 301L, 301R. Although not illustrated, the projection optical system 301 L includes the electro-optical device for the left eye, and the projection optical system 301 R includes the electro-optical device for the right eye. The organic EL device of the above exemplary embodiment is employed as these electro-optical devices. As a result, it is possible to provide the head-mounted display 300 in which the sealing performance of the sub-pixels PxR, PxG is improved, the intrusion of moisture, etc. is suppressed, and the reliability is improved.

Figure 13:
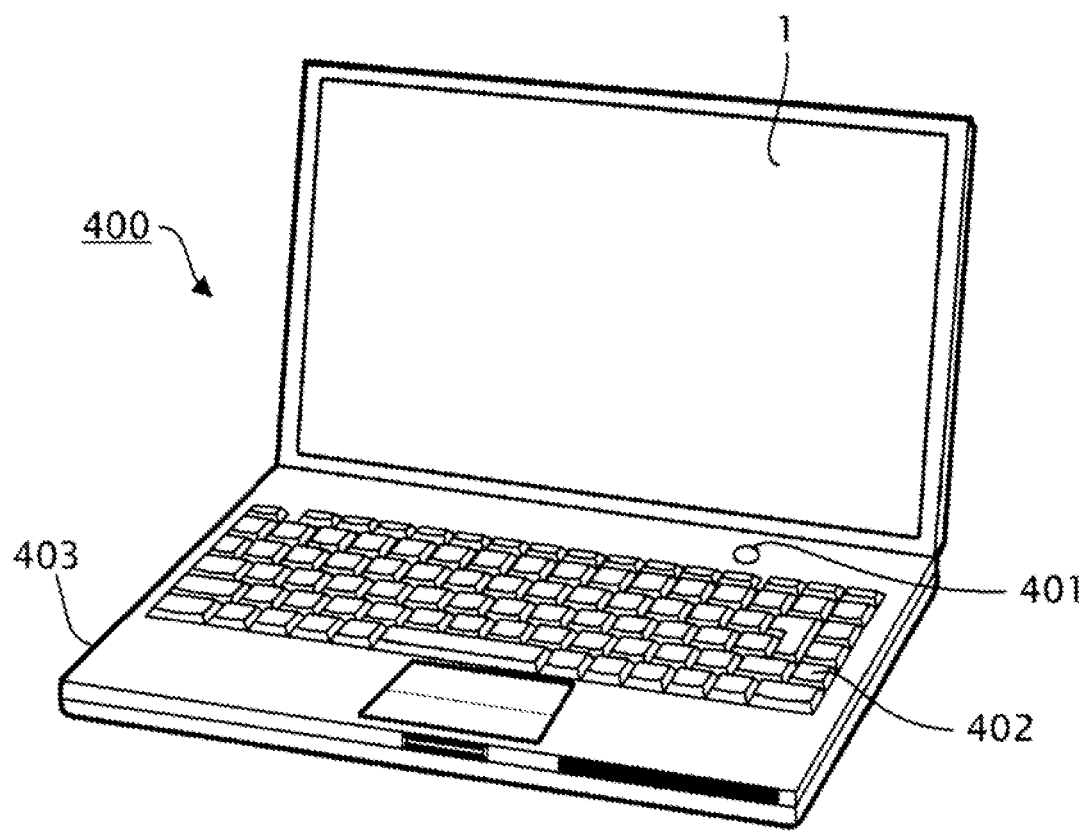
FIG. 13 is a perspective view illustrating an appearance of a personal computer as an electronic apparatus.

As illustrated in FIG. 13, a personal computer 400 as an electronic apparatus of the present exemplary embodiment includes the organic EL device 1 of the above-described exemplary embodiment for displaying various images, and a main body 403 provided with a power switch 401 and a keyboard 402. As a result, it is possible to provide the personal computer 400 in which the sealing performance of the sub-pixels PxP, PxG is improved, the intrusion of moisture, etc. is suppressed, and the reliability is improved.

In addition to the electronic apparatuses described above, examples of electronic apparatuses in which the electro-optical device of the present disclosure is adopted include a mobile phone, a smart phone, a personal digital assistant (PDA), a digital still camera, a television, a video camera, a car navigation device, a display such as an in-vehicle instrument panel, an electronic organizer, electronic paper, a calculator, a word processor, a workstation, a television phone, and a POS (Point Of Sale) terminal, etc. Further, the organic EL device as the electro-optical device of the above exemplary embodiment can be applied as a display unit provided at an electric device such as a printer, a scanner, a copying machine, and a video player.

What is claimed is:
1. An electro-optical device comprising:
an electrode;
a first reflection layer provided so as to be separate from the electrode by a first optical distance;
a first pixel electrode provided between the electrode and the first reflection layer;
a light emitting layer provided between the electrode and the first pixel electrode;
a first optical distance adjustment layer provided between the first pixel electrode and the first reflection layer; and
a first relay layer provided between the first pixel electrode and the first reflection layer, and configured to electrically couple the first pixel electrode and the first reflection layer, wherein
the first optical distance adjustment layer is provided so as to be separate from the first relay layer.
2. The electro-optical device according to claim 1, further comprising:
a second reflection layer provided so as to be separate from the electrode by a second optical distance shorter than the first optical distance;
a second pixel electrode provided between the electrode and the second reflection layer;
a second optical distance adjustment layer provided between the second pixel electrode and the second reflection layer, the second optical distance adjustment layer being thinner than the first optical distance adjustment layer; and
a second relay layer provided between the second pixel electrode and the second reflection layer, and configured to electrically couple the second pixel electrode and the second reflection layer, wherein
the second optical distance adjustment layer is provided so as to be separate from the second relay layer.
3. The electro-optical device according to claim 1, wherein
in plan view, the first relay layer does not overlap with the first optical distance adjustment layer.
4. The electro-optical device according to claim 2, wherein in plan view, the first relay layer does not overlap with the first optical distance adjustment layer, and in plan view, the second relay layer does not overlap with the second optical distance adjustment layer.

5. The electro-optical device according to claim 1, wherein in plan view, an end portion of the first optical distance adjustment layer is disposed between a first light emitting region in which the first pixel electrode and the light emitting layer come into contact, and the first relay layer.

6. The electro-optical device according to claim 3, wherein in plan view, an end portion of the first optical distance adjustment layer is disposed between a first light emitting region in which the first pixel electrode and the light emitting layer come into contact, and the first relay layer.

7. The electro-optical device according to claim 2, wherein in plan view, an end portion of the first optical distance adjustment layer is disposed between a first light emitting region in which the first pixel electrode and the light emitting layer come into contact, and the first relay layer, and in plan view, an end portion of the second optical distance adjustment layer is disposed between a second light emitting region in which the second pixel electrode and the light emitting layer come into contact, and the second relay layer.

8. The electro-optical device according to claim 4, wherein in plan view, an end portion of the first optical distance adjustment layer is disposed between a first light emitting region in which the first pixel electrode and the light emitting layer come into contact, and the first relay layer, and in plan view, an end portion of the second optical distance adjustment layer is disposed between a second light emitting region in which the second pixel electrode and the light emitting layer come into contact, and the second relay layer.

9. The electro-optical device according to claim 2, further comprising:

a third reflection layer provided so as to be separate from the electrode by a third optical distance shorter than the second optical distance;

a third pixel electrode provided between the electrode and the third reflection layer; and a third relay layer provided between the third pixel electrode and the third reflection layer, and configured to electrically couple the third pixel electrode and the third reflection layer, wherein a distance between the first reflection layer and the electrode in a region in which the first relay layer is provided is equal to a distance between the second reflection layer and the electrode in a region in which the second relay layer is provided, and a distance between the third reflection layer and the electrode in a region in which the third relay layer is provided.

10. The electro-optical device according to claim 4, further comprising:

a third reflection layer provided so as to be separate from the electrode by a third optical distance shorter than the second optical distance;

a third pixel electrode provided between the electrode and the third reflection layer; and a third relay layer provided between the third pixel electrode and the third reflection layer, and configured to electrically couple the third pixel electrode and the third reflection layer, wherein a distance between the first reflection layer and the electrode in a region in which the first relay layer is provided is equal to a distance between the second reflection layer and the electrode in a region in which the second relay layer is provided, and a distance between the third reflection layer and the electrode in a region in which the third relay layer is provided.

11. The electro-optical device according to claim 7, further comprising:

a third reflection layer provided so as to be separate from the electrode by a third optical distance shorter than the second optical distance;

a third pixel electrode provided between the electrode and the third reflection layer; and a third relay layer provided between the third pixel electrode and the third reflection layer, and configured to electrically couple the third pixel electrode and the third reflection layer, wherein a distance between the first reflection layer and the electrode in a region in which the first relay layer is provided is equal to a distance between the second reflection layer and the electrode in a region in which the second relay layer is provided, and a distance between the third reflection layer and the electrode in a region in which the third relay layer is provided.

12. The electro-optical device according to claim 1, wherein the first optical distance adjustment layer is an insulating layer including silicon oxide.

13. The electro-optical device according to claim 1, wherein the first optical distance adjustment layer is a transparent conductive layer including the same material as the first pixel electrode.

14. An electronic apparatus comprising the electro-optical device according to claim 1.

* * * * *